(12) United States Patent
Howard et al.

(10) Patent No.: US 10,381,224 B2
(45) Date of Patent: Aug. 13, 2019

(54) METHOD OF PROVIDING AN ELECTRONIC DEVICE AND ELECTRONIC DEVICE THEREOF

(71) Applicant: Arizona Board of Regents on behalf of Arizona State University, Scottsdale, AZ (US)

(72) Inventors: Emmett Howard, Tempe, AZ (US); Nicholas Munizza, Gilbert, AZ (US); Paul Yee, Chandler, AZ (US); Zachary Hartke, Chandler, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

(21) Appl. No.: 15/831,175

(22) Filed: Dec. 4, 2017

(65) Prior Publication Data

US 2018/0096848 A1    Apr. 5, 2018

Related U.S. Application Data

(63) Continuation of application No. PCT/US2016/036502, filed on Jun. 8, 2016, and a
(Continued)

(51) Int. Cl.
*H01L 21/44*   (2006.01)
*H01L 21/20*   (2006.01)
(Continued)

(52) U.S. Cl.
CPC .... *H01L 21/2007* (2013.01); *H01L 21/02381* (2013.01); *H01L 21/02565* (2013.01);
(Continued)

(58) Field of Classification Search
CPC ............. H01L 21/2007; H01L 21/4857; H01L 21/02381; H01L 51/0097; H01L 21/02565
(Continued)

(56) References Cited

U.S. PATENT DOCUMENTS

| 3,089,801 A | 5/1963 | Tierney et al. |
| 3,684,637 A | 8/1972 | Andersen et al. |

(Continued)

FOREIGN PATENT DOCUMENTS

| CN | 1332599 | 1/2002 |
| CN | 1118075 | 8/2003 |

(Continued)

OTHER PUBLICATIONS

International Search Report and Written Opinion for PCT/US2016/036505, dated Mar. 17, 2017, 15 pages.
(Continued)

*Primary Examiner* — Vu A Vu
(74) *Attorney, Agent, or Firm* — Bryan Cave Leighton Paisner LLP

(57) ABSTRACT

Some embodiments include a method. The method can include: providing a carrier substrate; providing a first bond promoting layer over the carrier substrate; providing a second bond promoting layer over the carrier substrate; and depositing a first device substrate over the carrier substrate, the first bond promoting layer, and the second bond promoting layer. The first device substrate can be configured to bond to the carrier substrate with a first device substrate-carrier substrate adhesion strength. Meanwhile, depositing the first device substrate can include: bonding the first device substrate to the first bond promoting layer, the first device substrate bonding to the first bond promoting layer with a first device substrate-first bond promoting layer adhesion strength greater than the first device substrate-
(Continued)

carrier substrate adhesion strength; and coupling the first device substrate to the carrier substrate. Other embodiments of related methods and devices are also disclosed.

20 Claims, 9 Drawing Sheets

Related U.S. Application Data continuation-in-part of application No. PCT/US2015/012717, filed on Jan. 23, 2015, and a continuation-in-part of application No. PCT/US2015/029991, filed on May 8, 2015.

(60) Provisional application No. 62/173,282, filed on Jun. 9, 2015, provisional application No. 62/173,278, filed on Jun. 9, 2015, provisional application No. 61/930,853, filed on Jan. 23, 2014, provisional application No. 61/992,799, filed on May 13, 2014.

(51) Int. Cl.
| | |
|---|---|
| H01L 21/02 | (2006.01) |
| H01L 51/00 | (2006.01) |
| H01L 21/48 | (2006.01) |
| H01L 21/683 | (2006.01) |

(52) U.S. Cl.
CPC ...... H01L 21/4857 (2013.01); H01L 21/6835 (2013.01); H01L 51/003 (2013.01); H01L 51/0097 (2013.01); H01L 2221/6835 (2013.01); H01L 2221/68345 (2013.01); H01L 2221/68381 (2013.01); Y02E 10/549 (2013.01)

(58) Field of Classification Search
USPC ........................................................ 438/654
See application file for complete search history.

(56) References Cited

U.S. PATENT DOCUMENTS

| | | | |
|---|---|---|---|
| 3,723,635 A | 3/1973 | Smith | |
| 4,337,107 A | 6/1982 | Eshleman | |
| 4,349,593 A | 9/1982 | Blechstein | |
| 4,489,487 A | 12/1984 | Bura | |
| 4,858,073 A | 8/1989 | Gregory | |
| 5,098,772 A | 3/1992 | af Strom | |
| 5,117,114 A | 5/1992 | Street et al. | |
| 5,220,488 A | 6/1993 | Denes | |
| 5,229,882 A | 7/1993 | Rowland | |
| 5,252,383 A | 10/1993 | Fukutake et al. | |
| 5,264,063 A | 11/1993 | Martin | |
| 5,292,686 A | 3/1994 | Riley et al. | |
| 5,453,157 A | 9/1995 | Jeng | |
| 5,702,980 A | 12/1997 | Yu et al. | |
| 5,714,305 A | 2/1998 | Teng | |
| 5,842,722 A | 12/1998 | Carlson | |
| 5,853,511 A | 12/1998 | Fairbanks | |
| 5,861,470 A | 1/1999 | Voss et al. | |
| 5,869,150 A | 2/1999 | Iwamoto | |
| 5,890,429 A | 4/1999 | Alam et al. | |
| 5,916,652 A | 6/1999 | Miner et al. | |
| 6,051,169 A | 4/2000 | Brown et al. | |
| 6,051,508 A | 4/2000 | Takase et al. | |
| 6,083,580 A | 7/2000 | Finestone et al. | |
| 6,177,163 B1 | 1/2001 | Blok et al. | |
| 6,358,832 B1 | 3/2002 | Edelstein et al. | |
| 6,482,288 B1 | 11/2002 | Kreckel et al. | |
| 6,531,389 B1 | 3/2003 | Shue et al. | |
| 6,541,398 B2 | 4/2003 | Grill et al. | |
| 6,572,780 B2 | 6/2003 | McCormack et al. | |
| 6,580,035 B1 | 6/2003 | Chung | |
| 6,627,037 B1 | 9/2003 | Kurokawa et al. | |
| 6,630,289 B1 | 10/2003 | Kwok et al. | |
| 6,632,746 B2 | 10/2003 | Kanegae et al. | |
| 6,670,265 B2 | 12/2003 | Wang et al. | |
| 6,746,969 B2 | 6/2004 | Shimada et al. | |
| 6,752,160 B2 | 6/2004 | Chen | |
| 6,808,773 B2 | 10/2004 | Shimamura et al. | |
| 6,825,068 B2 | 11/2004 | Denis et al. | |
| 6,856,670 B2 | 2/2005 | Hoheisel | |
| 7,078,702 B2 | 7/2006 | Ringermacher et al. | |
| 7,212,088 B1 | 5/2007 | Norregaard et al. | |
| 7,316,942 B2 | 1/2008 | Sarma et al. | |
| 7,329,601 B2 | 2/2008 | Miyajima | |
| 7,344,993 B2 | 3/2008 | Balasubramaniam et al. | |
| 7,375,341 B1 | 5/2008 | Nagarkar et al. | |
| 7,385,224 B2 | 6/2008 | Ishii et al. | |
| 7,481,901 B2 | 1/2009 | Toyoda et al. | |
| 7,538,038 B2 | 5/2009 | Matsushita et al. | |
| 7,563,026 B2 | 7/2009 | Mandelkem et al. | |
| 7,681,310 B2 | 3/2010 | Chinda et al. | |
| 7,713,369 B2 * | 5/2010 | Aspar | H01L 21/6835 156/249 |
| 7,795,006 B2 | 9/2010 | Nagino et al. | |
| 7,838,328 B2 | 11/2010 | Isa | |
| 7,906,193 B2 | 3/2011 | Yukawa et al. | |
| 8,038,820 B2 | 10/2011 | Kim et al. | |
| 8,048,251 B2 | 11/2011 | Yamashita et al. | |
| 8,383,520 B2 | 2/2013 | Marrs | |
| 8,481,859 B2 | 7/2013 | Haq et al. | |
| 8,962,449 B1 * | 2/2015 | Gandhi | H01L 21/76254 257/E21.122 |
| 8,992,712 B2 | 3/2015 | Loy et al. | |
| 8,999,778 B2 | 4/2015 | O'Rourke et al. | |
| 9,076,822 B2 | 7/2015 | Loy et al. | |
| 9,155,190 B2 | 10/2015 | Haq et al. | |
| 9,507,011 B2 | 11/2016 | Zhang et al. | |
| 9,601,530 B2 | 3/2017 | Marrs | |
| 2002/0008839 A1 | 1/2002 | Miyai et al. | |
| 2002/0018173 A1 | 2/2002 | Furukawa et al. | |
| 2002/0081863 A1 | 6/2002 | Shimada et al. | |
| 2003/0031296 A1 | 2/2003 | Hoheisel | |
| 2003/0069331 A1 | 4/2003 | Teiichi et al. | |
| 2003/0072889 A1 | 4/2003 | Abrams | |
| 2003/0143822 A1 | 7/2003 | Kondo et al. | |
| 2003/0201465 A1 | 10/2003 | Ryuzaki et al. | |
| 2004/0008298 A1 | 1/2004 | Kwok et al. | |
| 2004/0110326 A1 | 6/2004 | Forbes et al. | |
| 2004/0219289 A1 | 11/2004 | Lamotte et al. | |
| 2005/0186801 A1 | 8/2005 | Uno et al. | |
| 2005/0221542 A1 | 10/2005 | Yamazaki et al. | |
| 2005/0221599 A1 | 10/2005 | Kanegae et al. | |
| 2005/0233583 A1 | 10/2005 | Miyajima | |
| 2005/0242341 A1 | 11/2005 | Knudson et al. | |
| 2006/0017154 A1 | 1/2006 | Eguchi et al. | |
| 2006/0019491 A1 | 1/2006 | Soda | |
| 2006/0148141 A1 | 7/2006 | Seo et al. | |
| 2006/0169485 A1 | 8/2006 | Kawaguchi et al. | |
| 2006/0180815 A1 | 8/2006 | Sarma et al. | |
| 2006/0192229 A1 | 8/2006 | Kato et al. | |
| 2006/0194363 A1 | 8/2006 | Giesberg et al. | |
| 2006/0207967 A1 | 9/2006 | Bocko et al. | |
| 2006/0223282 A1 | 10/2006 | Amundson et al. | |
| 2007/0042140 A1 | 2/2007 | af Strom | |
| 2007/0054440 A1 | 3/2007 | Hu | |
| 2007/0241436 A1 | 10/2007 | Ookubo et al. | |
| 2007/0257311 A1 | 11/2007 | Kuwabara | |
| 2008/0038885 A1 | 2/2008 | Lee et al. | |
| 2008/0050548 A1 | 2/2008 | Abrams | |
| 2008/0090338 A1 | 4/2008 | Tredwell et al. | |
| 2008/0105877 A1 | 5/2008 | Yamazaki et al. | |
| 2008/0122121 A1 | 5/2008 | Suda et al. | |
| 2008/0179594 A1 | 7/2008 | Oh | |
| 2008/0224243 A1 | 9/2008 | Lee | |
| 2008/0315252 A1 | 12/2008 | Shim | |
| 2009/0004419 A1 | 1/2009 | Cok et al. | |
| 2009/0008132 A1 | 1/2009 | Takasawa et al. | |
| 2009/0072122 A1 | 3/2009 | Hiroshi et al. | |
| 2009/0101903 A1 | 4/2009 | Chen et al. | |
| 2009/0108304 A1 | 4/2009 | Ng et al. | |
| 2009/0134390 A1 | 5/2009 | Kodama et al. | |

(56) References Cited

U.S. PATENT DOCUMENTS

| | | |
|---|---|---|
| 2009/0176039 A1 | 7/2009 | af Strom |
| 2009/0202857 A1 | 8/2009 | Kerr et al. |
| 2009/0211791 A1 | 8/2009 | Tredwell et al. |
| 2009/0229874 A1 | 9/2009 | Katagiri et al. |
| 2009/0269874 A1 | 10/2009 | Huang |
| 2009/0294767 A1 | 12/2009 | Lujan et al. |
| 2009/0296754 A1 | 12/2009 | Ledentsov et al. |
| 2010/0003512 A1 | 1/2010 | Ookubo et al. |
| 2010/0003513 A1 | 1/2010 | Ookubo et al. |
| 2010/0025675 A1 | 2/2010 | Yamazki et al. |
| 2010/0038023 A1 | 2/2010 | Kho et al. |
| 2010/0051189 A1 | 3/2010 | Kawabata et al. |
| 2010/0059171 A1 | 3/2010 | Chun et al. |
| 2010/0059747 A1 | 3/2010 | Nakayama et al. |
| 2010/0078573 A1 | 4/2010 | Nishino et al. |
| 2010/0123131 A1 | 5/2010 | Tokunaga |
| 2010/0127279 A1 | 5/2010 | Takahashi |
| 2010/0140807 A1 | 6/2010 | Kobayashi et al. |
| 2010/0154992 A1 | 6/2010 | Feinstein et al. |
| 2010/0155694 A1 | 6/2010 | Miller et al. |
| 2010/0183872 A1 | 7/2010 | Nonaka et al. |
| 2010/0203296 A1 | 8/2010 | Tsai et al. |
| 2010/0219410 A1 | 9/2010 | Godo et al. |
| 2010/0267203 A1 | 10/2010 | Chen et al. |
| 2010/0295161 A1 | 11/2010 | Koduri |
| 2010/0320391 A1 | 12/2010 | Antonuk |
| 2010/0330748 A1 | 12/2010 | Chu et al. |
| 2011/0003442 A1 | 1/2011 | Wang et al. |
| 2011/0048611 A1 | 3/2011 | Carre et al. |
| 2011/0064953 A1 | 3/2011 | O'Rourke et al. |
| 2011/0069467 A1 | 3/2011 | Flaim et al. |
| 2011/0092006 A1 | 4/2011 | An et al. |
| 2011/0111194 A1 | 5/2011 | Carre et al. |
| 2011/0141076 A1 | 6/2011 | Fukuhara et al. |
| 2011/0141476 A1 | 6/2011 | Schmaelzle et al. |
| 2011/0204361 A1 | 8/2011 | Nishiki et al. |
| 2011/0220276 A1 | 9/2011 | Coleman et al. |
| 2011/0227203 A1 | 9/2011 | Marrs et al. |
| 2011/0228492 A1 | 9/2011 | Haq et al. |
| 2011/0230047 A1 | 9/2011 | Marrs |
| 2011/0240988 A1 | 10/2011 | Yano |
| 2011/0318544 A1 | 12/2011 | Chen et al. |
| 2012/0003815 A1 | 1/2012 | Lee |
| 2012/0043468 A1 | 2/2012 | Flitsch et al. |
| 2012/0061672 A1 | 3/2012 | O'Rourke et al. |
| 2012/0107978 A1 | 5/2012 | Shin et al. |
| 2012/0146713 A1 | 6/2012 | Kim et al. |
| 2012/0164408 A1 | 6/2012 | Hwu et al. |
| 2012/0168836 A1 | 7/2012 | Lee et al. |
| 2012/0235315 A1 | 9/2012 | Wu et al. |
| 2012/0300419 A1 | 11/2012 | Tang et al. |
| 2012/0329249 A1 | 12/2012 | Ahn et al. |
| 2013/0075739 A1 | 3/2013 | Loy et al. |
| 2013/0077033 A1 | 3/2013 | Li et al. |
| 2013/0082264 A1 | 4/2013 | Couture et al. |
| 2013/0115426 A1* | 5/2013 | Fang ............ H01L 27/1266 428/156 |
| 2013/0123882 A1 | 5/2013 | Towe |
| 2013/0161772 A1 | 6/2013 | Chan et al. |
| 2013/0271930 A1 | 10/2013 | Haq et al. |
| 2014/0008651 A1 | 1/2014 | Marrs |
| 2014/0065389 A1 | 3/2014 | Loy et al. |
| 2014/0254113 A1 | 9/2014 | Howard et al. |
| 2014/0274166 A1 | 9/2014 | Zhang et al. |
| 2014/0340857 A1 | 11/2014 | Hsu et al. |
| 2015/0064385 A1 | 3/2015 | Flaim et al. |
| 2015/0097301 A1 | 4/2015 | Gandhi |
| 2015/0125665 A1* | 5/2015 | Nakase ............ B32B 37/12 428/172 |
| 2015/0162392 A1 | 6/2015 | Lim et al. |
| 2016/0003953 A1 | 1/2016 | Kunnen et al. |
| 2016/0005170 A1 | 1/2016 | Thiagarajan et al. |
| 2016/0005183 A1 | 1/2016 | Thiagarajan et al. |
| 2016/0037294 A1 | 2/2016 | Zhang et al. |
| 2016/0181182 A1 | 6/2016 | Smith et al. |
| 2016/0181288 A1 | 6/2016 | Smith et al. |
| 2016/0225653 A1 | 8/2016 | Marrs et al. |
| 2016/0245689 A1 | 8/2016 | Smith et al. |
| 2016/0252632 A1 | 9/2016 | Smith et al. |
| 2016/0260765 A1 | 9/2016 | Marrs |
| 2016/0260768 A1 | 9/2016 | Smith et al. |
| 2016/0329268 A1 | 11/2016 | Howard et al. |
| 2016/0343593 A1 | 11/2016 | Kang et al. |
| 2017/0062380 A1 | 3/2017 | Howard et al. |

FOREIGN PATENT DOCUMENTS

| | | |
|---|---|---|
| CN | 1454122 | 11/2003 |
| CN | 101231972 | 7/2007 |
| CN | 101288348 | 10/2008 |
| CN | 103531442 | 1/2014 |
| EP | 2088839 | 8/2009 |
| JP | 01198094 | 9/1989 |
| JP | 07022795 | 1/1995 |
| JP | 08148814 | 7/1996 |
| JP | 11340462 | 10/1999 |
| JP | 2000338454 | 12/2000 |
| JP | 2004311912 | 11/2004 |
| JP | 2004323543 | 11/2004 |
| JP | 2005123576 | 12/2005 |
| JP | 2007073559 | 3/2007 |
| JP | 2007123861 | 5/2007 |
| JP | 2007146121 | 6/2007 |
| JP | 200971057 | 4/2009 |
| JP | 2010067849 | 3/2010 |
| JP | 2010226101 | 10/2010 |
| JP | 2012212939 | 11/2012 |
| KR | 20070103050 | 10/2007 |
| KR | 100810708 | 3/2008 |
| KR | 1020090098033 | 9/2009 |
| KR | 1020100007703 | 1/2010 |
| KR | 1020100043654 | 4/2010 |
| KR | 1020130086807 | 8/2013 |
| WO | 1998052391 | 11/1998 |
| WO | 2006088564 | 8/2006 |
| WO | 2007083906 | 7/2007 |
| WO | 2007108659 | 9/2007 |
| WO | 2008005979 | 1/2008 |
| WO | 2010051106 | 5/2010 |
| WO | 2010065457 | 6/2010 |
| WO | 2010065459 | 6/2010 |
| WO | 2010065542 | 6/2010 |
| WO | 2010138811 | 12/2010 |
| WO | 2012021196 | 2/2012 |
| WO | 2012021197 | 2/2012 |
| WO | 2012138903 | 10/2012 |
| WO | 2013082138 | 6/2013 |
| WO | 2014039693 | 3/2014 |
| WO | 2014039698 | 3/2014 |
| WO | 2014054949 | 4/2014 |
| WO | 2014152919 | 9/2014 |
| WO | 2014152929 | 9/2014 |
| WO | 2014165149 | 10/2014 |
| WO | 2015057719 | 4/2015 |
| WO | 2015058523 | 4/2015 |
| WO | 2015069566 | 5/2015 |
| WO | 2015069567 | 5/2015 |
| WO | 2015156891 | 10/2015 |
| WO | 2015175353 | 11/2015 |
| WO | 2016025463 | 2/2016 |
| WO | 2017030632 | 2/2017 |
| WO | 2017034644 | 3/2017 |
| WO | 2017034645 | 3/2017 |

OTHER PUBLICATIONS

International Search Report and Written Opinion for PCT/US2016/036502, dated Mar. 6, 2017, 14 pages.

J. C. Park, S. Kim, S. Kim, C. Kim, I. Song, Y. Park, U. Jung, D. H. Kim, and J. Lee, "Highly Stable Transparent Amorphous Oxide Semiconductor Thin-Film Transistors Having Double-Stacked Active Layers," Adv. Mater. 2010, 22, 5512-5516.

(56) References Cited

OTHER PUBLICATIONS

International Search Report and Written Opinion for PCT/US2014/060501, dated Jan. 19, 2015, 14 pages.
International Search Report and Written Opinion for PCT/US2015/029991, dated Jul. 31, 2015, 13 pages.
International Search Report and Written Opinion for PCT/US2013/058284, dated Dec. 26, 2013, 12 pages.
International Search Report and Written Opinion for PCT/US2013/058293, dated Dec. 26, 2013, 12 pages.
International Search Report and Written Opinion for PCT/US2012/066833, dated Jan. 17, 2013, 11 pages.
International Search Report and Written Opinion for PCT/US2011/037207, dated Feb. 21, 2012, 10 pages.
International Search Report and Written Opinion for PCT/US2011/037226, dated Feb. 21, 2012, 10 pages.
International Search Report and Written Opinion for PCT/US2012/032388, dated Dec. 10, 2012, 10 pages.
International Search Report and Written Opinion for PCT/US2010/036569, dated Dec. 27, 2012, 11 pages.
International Search Report and Written Opinion for PCT/US2009/066114 dated Mar. 9, 2010, 8 pages.
International Search Report and Written Opinion for PCT/US2009/066259, dated May 5, 2010, 8 pages.
International Search Report and Written Opinion for PCT/US2009/066111, dated Oct. 25, 2010, 7 pages.
R. Lujan and R. A. Street, "Oxide TFTs for a Flexible X-Ray Image Sensor," Palo Alto Research Center, Flex Tech Alliance Presents: Metal Oxide TFT Devices and Technology Workshop (Jul. 2012).
R. A. Street, W. S. Wong, T. Ng & R. Lujan, "Amorphous Silicon Thin Film Transistor Image Sensors," Philosophical Magazine, 89:28-30, 2687-2697 (Oct. 2009).
R. A. Lujan and R. A. Street, "Flexible X-Ray Detector Array Fabricated With Oxide Thin-Film Transistors," IEEE Electron Device Letters, vol. 33, No. 5, May 2012.
International Search Report and Written Opinion for PCT/US2017/037882 dated Dec. 5, 2017, 14 pages.

\* cited by examiner

METHOD OF PROVIDING AN ELECTRONIC DEVICE AND ELECTRONIC DEVICE THEREOF

CROSS-REFERENCE TO RELATED APPLICATIONS

This application is a continuation of International Patent Application Serial No. PCT/US2016/036502, filed Jun. 8, 2016. International Patent Application Serial No. PCT/US2016/036502 claims the benefit of U.S. Provisional Patent Application Ser. No. 62/173,282, filed Jun. 9, 2015, and U.S. Provisional Patent Application Ser. No. 62/173,278, filed Jun. 9, 2015. Further, International Patent Application Serial No. PCT/US2016/036502 is a continuation-in-part of International Patent Application Serial No. PCT/US2015/012717, filed Jan. 23, 2015, and of International Patent Application Serial No. PCT/US2015/029991, filed May 8, 2015. International Patent Application Serial No. PCT/US2015/012717 claims the benefit of U.S. Provisional Patent Application Ser. No. 61/930,853, filed Jan. 23, 2014, and International Patent Application Serial No. PCT/US2015/029991 claims the benefit of U.S. Provisional Patent Application Ser. No. 61/992,799, filed May 13, 2014. International Patent Application Serial No. PCT/US2016/036502, International Patent Application Serial No. PCT/US2015/029991, International Patent Application Serial No. PCT/US2015/012717, U.S. Provisional Patent Application Ser. No. 62/173,282, U.S. Provisional Patent Application Ser. No. 62/173,278, U.S. Provisional Patent Application Ser. No. 61/930,853, and U.S. Provisional Patent Application Ser. No. 61/992,799 are incorporated herein by reference in their entirety.

STATEMENT REGARDING FEDERALLY SPONSORED RESEARCH OR DEVELOPMENT

This invention was made with government support under W911NF-04-2-0005 awarded by the Army Research Office. The government has certain rights in the invention.

FIELD OF THE INVENTION

This invention relates generally to fabricating electronic devices, and relates more particularly to fabricating electronic devices having one or more semiconductor elements over flexible substrates and the electronic devices therefrom.

DESCRIPTION OF THE BACKGROUND

In the electronics industry, flexible substrates are quickly becoming popular as a base for electronic devices. Flexible substrates can include a wide variety of materials, such as, for example, any of a myriad of plastics, metal foils, and glasses (e.g. fluorosilicate glass, borosilicate glass, Corning® glass, Willow™ glass, and/or Vitrelle glass, etc.). Once one or more desired semiconductor elements are formed over a surface of the flexible substrate, the flexible substrate can be attached to a final product or incorporated into a further structure. Typical examples of such products or structures are active matrices on flat panel displays, RFID (radio-frequency identification) tags on various commercial products in retail stores, a variety of sensors, etc.

A need exists in the art to develop a method for fabricating electronic devices having flexible substrates that allows for improved electrical characteristics, such as, for example, improved parametric characteristics and/or lifetime, and reduced bowing, warping, and/or distortion.

BRIEF DESCRIPTION OF THE DRAWINGS

To facilitate further description of the embodiments, the following drawings are provided in which.

Figure 1:
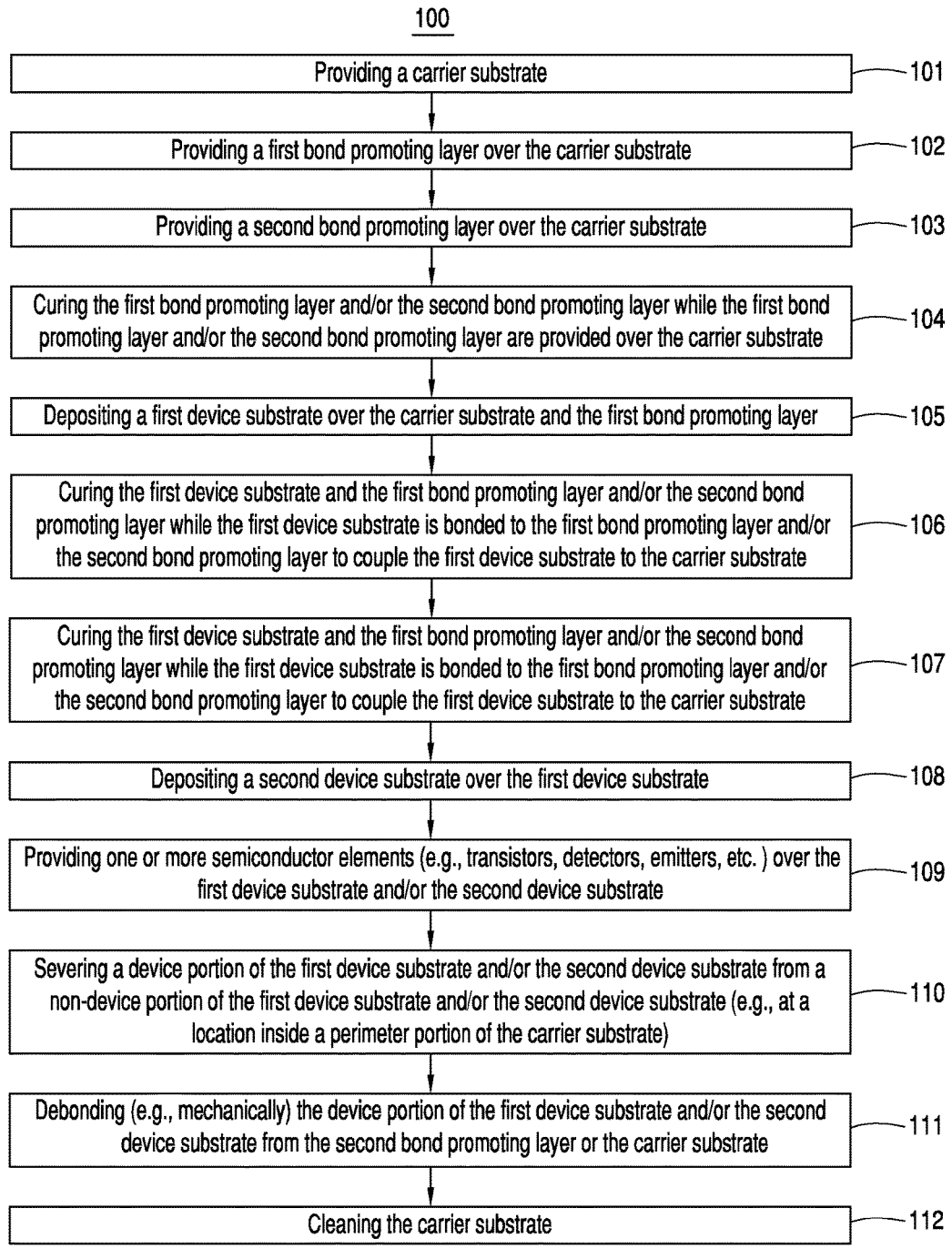
FIG. 1 illustrates a flow chart for an embodiment of a method.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled," and the like does not mean that the coupling, etc. in question is or is not removable.

The term "bowing" as used herein means the curvature of a substrate about a median plane, which is parallel to the top and bottom sides, or major surfaces of the substrate. The term "warping" as used herein means the linear displacement of the surface of a substrate with respect to a z-axis, which is perpendicular to the top and bottom sides, or major surfaces of the substrate. The term "distortion" as used herein means the displacement of a substrate in-plane (i.e., the x-y plane, which is parallel to the top and bottom sides, or major surfaces of the substrate). For example, distortion could include shrinkage in the x-y plane of a substrate and/or expansion in the x-y plane of the substrate.

The term "CTE matched material" and the like as used herein means a material that has a coefficient of thermal expansion (CTE) which differs from the CTE of a reference material by less than about 20 percent (%). Preferably, the CTEs differ by less than about 10%, 5%, 3%, or 1%.

The term "flexible substrate" as used herein means a free-standing substrate that readily adapts its shape. Accordingly, in many embodiments, the flexible substrate can comprise (e.g., consist of) a flexible material, and/or can comprise a thickness (e.g., an average thickness) that is sufficiently thin so that the substrate readily adapts in shape. In these or other embodiments, a flexible material can refer to a material having a low elastic modulus. Further, a low elastic modulus can refer to an elastic modulus of less than approximately five GigaPascals (GPa). In some embodiments, a substrate that is a flexible substrate because it is sufficiently thin so that it readily adapts in shape, may not be a flexible substrate if implemented with a greater thickness, and/or the substrate may have an elastic modulus exceeding five GPa. For example, the elastic modulus could be greater than or equal to approximately five GPa but less than or equal to approximately twenty GPa, fifty GPa, seventy GPa, or eighty GPa. In some embodiments, exemplary materials for a substrate that is a flexible substrate because it is sufficiently thin so that it readily adapts in shape, but that may not be a flexible substrate if implemented with a greater thickness, can comprise certain glasses (e.g., fluorosilicate glass, borosilicate glass, Corning® glass, Willow™ glass, and/or Vitrelle glass, etc., such as, for example, as manufactured by Corning Inc. of Corning, N.Y., United States of America, etc.) or silicon having a thickness greater than or equal to approximately 25 micrometers and less than or equal to approximately 100 micrometers.

Meanwhile, the term "rigid substrate" as used herein can mean a free-standing substrate that does not readily adapt its shape and/or a substrate that is not a flexible substrate. In some embodiments, the rigid substrate can be devoid of flexible material and/or can comprise a material having an elastic modulus greater than the elastic modulus of a flexible substrate. In various embodiments, the rigid substrate can be implemented with a thickness that is sufficiently thick so that the substrate does not readily adapt its shape. In these or other examples, the increase in rigidity of the carrier substrate provided by increasing the thickness of the carrier substrate can be balanced against the increase in cost and weight provided by increasing the thickness of the carrier substrate.

As used herein, "polish" can mean to lap and polish a surface or to only lap the surface.

DETAILED DESCRIPTION OF EXAMPLES OF EMBODIMENTS

Some embodiments include a method. The method can comprise: providing a carrier substrate; providing a first bond promoting layer over the carrier substrate, the first bond promoting layer comprising a first bond promoting layer material; providing a second bond promoting layer over the carrier substrate, the second bond promoting layer comprising a second bond promoting layer material different than the first bond promoting layer material; and depositing a first device substrate over the carrier substrate, the first bond promoting layer, and the second bond promoting layer. The first device substrate can be configured to bond to the carrier substrate with a first device substrate-carrier substrate adhesion strength. Meanwhile, depositing the first device substrate can comprise: bonding the first device substrate to the first bond promoting layer, the first device substrate bonding to the first bond promoting layer with a first device substrate-first bond promoting layer adhesion strength greater than the first device substrate-carrier substrate adhesion strength; and coupling the first device substrate to the carrier substrate.

Further embodiments include a method. The method can comprise: providing a carrier substrate; providing a first bond promoting layer over the carrier substrate, the first bond promoting layer comprising a first bond promoting layer material; providing a second bond promoting layer over the carrier substrate, the second bond promoting layer comprising a second bond promoting layer material different than the first bond promoting layer material; and depositing a first device substrate over the carrier substrate, the first bond promoting layer, and the second bond promoting layer. The first device substrate can be configured to bond to the carrier substrate with a first device substrate-carrier substrate adhesion strength. Meanwhile, depositing the first device substrate can comprise: bonding the first device substrate to the first bond promoting layer, the first device substrate bonding to the first bond promoting layer with a first device substrate-first bond promoting layer adhesion strength greater than the first device substrate-carrier substrate adhesion strength; and coupling the first device substrate to the carrier substrate. Further, the first device substrate-carrier substrate adhesion strength can comprise a first tensile adhesion strength less than approximately 0.0390 MegaPascal, and the first device substrate-first bond promoting layer adhesion strength can comprise a second tensile adhesion strength greater than or equal to approximately 0.0390 MegaPascal, and/or the first device substrate-carrier substrate adhesion strength can comprise a first peel adhesion strength less than approximately 0.0100 kilogram per centimeter, and the first device substrate-first bond promoting layer adhesion strength can comprise a second peel adhesion strength greater than or equal to approximately 0.0100 kilogram per centimeter. Further still, providing the first bond promoting layer over the carrier substrate can comprise providing the first bond promoting layer over a perimeter portion of the carrier substrate. Also, the carrier substrate can comprise a rigid substrate, and the first device substrate can comprise a flexible substrate.

Other embodiments include a system. The system comprises a carrier substrate comprising a rigid substrate. The system also comprises a first bond promoting layer over the carrier substrate, and a second bond promoting layer over the carrier substrate. The first bond promoting layer comprises a first bond promoting layer material, and the second bond promoting layer comprises a second bond promoting layer material different than the first bond promoting layer material. Meanwhile, the system comprises a first device substrate over the carrier substrate, the first bond promoting layer, and the second bond promoting layer, and comprises one or more semiconductor elements over the first device substrate. The first device substrate can be configured to bond to the carrier substrate with a first device substrate-carrier substrate adhesion strength. Further, the first device substrate can be bonded to the first bond promoting layer with a first device substrate-first bond promoting layer adhesion strength greater than the first device substrate-carrier substrate adhesion strength, and can be coupled to the carrier substrate.

Some embodiments include a method. The method can comprise: providing a carrier substrate; providing a bond promoting layer over the carrier substrate, the bond promoting layer comprising a bond promoting layer material; and depositing a first device substrate over the carrier substrate and the bond promoting layer. The first device substrate can be configured to bond to the carrier substrate with a first device substrate-carrier substrate adhesion strength. Meanwhile, depositing the first device substrate can comprise: bonding the first device substrate to the bond promoting layer, the first device substrate bonding to the bond promoting layer with a first device substrate-bond promoting layer adhesion strength greater than the first device substrate-carrier substrate adhesion strength; and coupling the first device substrate to the carrier substrate.

Further embodiments include a method. The method can comprise: providing a carrier substrate; providing a bond promoting layer over the carrier substrate, the bond promoting layer comprising a bond promoting layer material; and depositing a first device substrate over the carrier substrate and the bond promoting layer. The first device substrate can be configured to bond to the carrier substrate with a first device substrate-carrier substrate adhesion strength. Meanwhile, depositing the first device substrate can comprise: bonding the first device substrate to the bond promoting layer, the first device substrate bonding to the bond promoting layer with a first device substrate-bond promoting layer adhesion strength greater than the first device substrate-carrier substrate adhesion strength; and coupling the first device substrate to the carrier substrate. Further, the first device substrate-carrier substrate adhesion strength can comprise a first tensile adhesion strength less than approximately 0.0390 MegaPascal, and the first device substrate-first bond promoting layer adhesion strength can comprise a second tensile adhesion strength greater than or equal to approximately 0.0390 MegaPascal; and/or the first device substrate-carrier substrate adhesion strength can comprise a first peel adhesion strength less than approximately 0.0100 kilogram per centimeter, and the first device substrate-first bond promoting layer adhesion strength can comprise a second peel adhesion strength greater than or equal to approximately 0.0100 kilogram per centimeter. Further still, providing the bond promoting layer over the carrier substrate can comprise providing the bond promoting layer over only a perimeter portion of a second surface of the carrier substrate, or providing the bond promoting layer over the carrier substrate can comprise providing the bond promoting layer over all of the second surface of the carrier substrate. Also, the carrier substrate can comprise a rigid substrate, and the first device substrate can comprise a flexible substrate.

Other embodiments include a system. The system comprises a carrier substrate comprising a rigid substrate. The system also comprises a bond promoting layer over the carrier substrate, and the bond promoting layer comprises a bond promoting layer material. Further, the system comprises a first device substrate over the carrier substrate and the bond promoting layer, and one or more semiconductor elements over the first device substrate. The first device substrate can be configured to bond to the carrier substrate with a first device substrate-carrier substrate adhesion strength, can be bonded to the bond promoting layer with a first device substrate-bond promoting layer adhesion strength greater than the first device substrate-carrier substrate adhesion strength, and can be coupled to the carrier substrate.

Turning to the drawings, FIG. 1 illustrates a flow chart for an embodiment of method 100. Method 100 is merely exemplary and is not limited to the embodiments presented herein. Method 100 can be employed in many different embodiments or examples not specifically depicted or described herein. In some embodiments, the activities of method 100 can be performed in the order presented. In other embodiments, the activities of method 100 can be performed in any other suitable order. In still other embodiments, one or more of the activities in method 100 can be combined or skipped.

In many embodiments, method 100 can comprise a method of providing (e.g., manufacturing) an electronic device. Although the electronic device can comprise any suitable electronic device, in many embodiments, the electronic device can comprise an electronic display, an x-ray sensor, a biological sensor, etc. Generally speaking, coupling a device substrate of the electronic device to a carrier substrate when one or more semiconductor elements of the electronic device are being provided over the device substrate can facilitate providing the electronic device. For example, in some embodiments, when the device substrate comprises a flexible substrate and the carrier substrate comprises a rigid substrate, coupling the device substrate of the electronic device to the carrier substrate can permit the semiconductor element(s) of the electronic device to be provided over the device substrate using semiconductor manufacturing infrastructure configured for processing over rigid substrates. However, if the device substrate becomes unintentionally decoupled from the carrier substrate when the semiconductor element(s) are being provided over the device substrate, run-out printing errors can result. Therefore, in many embodiments, implementing method 100 can permit the device substrate of the electronic device to remain securely coupled to the carrier substrate when the semiconductor element(s) are being provided over the device substrate, and to be subsequently decoupled from the carrier substrate without damaging the semiconductor element(s), where the device substrate would otherwise bond with the carrier substrate with a sufficiently low adhesion strength to potentially cause the device substrate to unintentionally become decoupled from the carrier substrate when the semiconductor element(s) are being provided over the device substrate.

Figure 17:
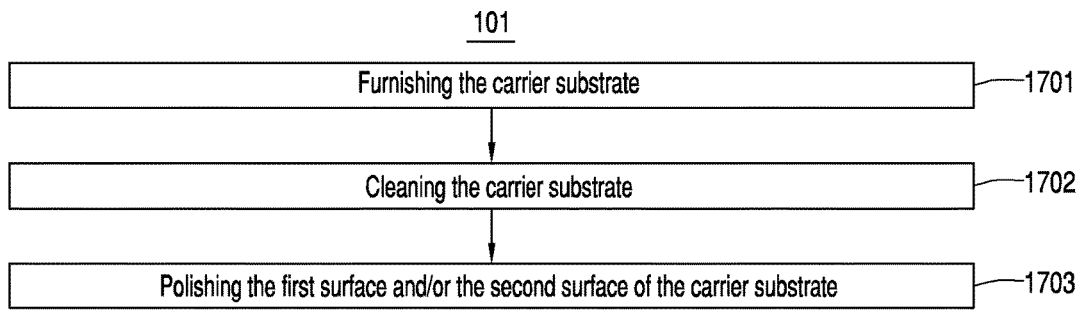
FIG. 17 illustrates an exemplary activity of providing the carrier substrate, according to the embodiment of FIG. 1.

For example, method 100 can comprise activity 101 of providing a carrier substrate. FIG. 17 illustrates an exemplary activity 101, according to the embodiment of FIG. 1.

In many embodiments, activity 101 can comprise activity 1701 of furnishing the carrier substrate. The carrier substrate can comprise a first surface and a second surface opposite the first surface.

Further, in many embodiments, the carrier substrate can comprise a rigid substrate. The carrier substrate (e.g., rigid substrate) can comprise one or more carrier substrate materials, and in some embodiments, one or more carrier coating materials at least partially or fully coating the carrier substrate material(s). For example, in many embodiments, the carrier coating material(s) can coat the carrier substrate material(s) at least at the second surface of the carrier substrate. In these embodiments, the carrier coating material(s) can form at least the second surface of the carrier substrate.

The carrier substrate material(s) can comprise one or more materials having the characteristics of a rigid substrate as defined above. In these or other embodiments, exemplary carrier substrate material(s) can comprise one or more non-silicon materials and/or one or more silicon materials. Non-silicon material(s) can consist of one or more materials devoid of silicon, and silicon material(s) can comprise one more materials comprising silicon. Exemplary non-silicon material(s) can comprise alumina ($Al_2O_3$), sapphire, metal, metal alloy (e.g., steel, such as, for example, stainless steel), non-silicon glass, etc.; and exemplary silicon material(s) can comprise silicon, amorphous silicon, silicon nitride, silicon dioxide, barium borosilicate, soda lime silicate, alkali silicate, silicon-oxygen tetrahedral, etc.

In some embodiments, the carrier substrate (e.g., rigid substrate) can comprise the carrier coating material(s) when the carrier substrate material(s) comprise non-silicon material(s). In these or other embodiments, the carrier coating material(s) can comprise silicon material(s).

Meanwhile, in some embodiments, the carrier substrate material(s) and/or the carrier coating material(s) can be selected so that a CTE of the carrier substrate material(s) and/or the carrier coating material(s) approximately matches a CTE of each other and/or the material or materials of the first bond promoting layer, second bond promoting layer, the first device substrate, and/or the second device substrate, each of which is described in greater detail herein. Likewise, in some embodiments, the material(s) for the first bond promoting layer, second bond promoting layer, the first device substrate, and/or the second device substrate can be selected so as to be CTE matched with the carrier substrate material(s) and/or the carrier coating material(s) and/or to be CTE matched with each other. Implementing the carrier substrate, the first bond promoting layer, the second bond promoting layer, the first device substrate, and/or the second device substrate with materials having non-matched CTEs can create stress between the carrier substrate, the first bond promoting layer, the second bond promoting layer, the first device substrate, and/or the second device substrate. Nonetheless, in other embodiments, one or more of the material(s) of the carrier substrate, first bond promoting layer, second bond promoting layer, the first device substrate, and/or the second device substrate can have non-matched CTEs with one or more other material(s) of the carrier substrate, first bond promoting layer, second bond promoting layer, the first device substrate, and/or the second device substrate.

Meanwhile, in many embodiments, the carrier substrate can be a wafer or panel. The carrier substrate (e.g., the wafer or panel) can comprise any suitable largest dimension (e.g., diameter), such as, for example, approximately 1.969 inches (approximately 5.000 centimeters), approximately 2.000 inches (approximately 5.080 centimeters), approximately 2.953 inches (approximately 7.500 centimeters), approximately 3.000 inches (approximately 7.620 centimeters), approximately 3.937 inches (approximately 10.00 centimeters), approximately 4.000 inches (approximately 10.16 centimeters), approximately 4.921 inches (approximately 12.50 centimeters), approximately 5.000 inches (approximately 12.70 centimeters), approximately 5.906 inches (approximately 15.00 centimeters), approximately 6.000 inches (approximately 15.24 centimeters), approximately 7.874 inches (approximately 20.00 centimeters), approximately 8.000 inches (approximately 20.32 centimeters), approximately 11.81 inches (approximately 30.00 centimeters), approximately 12.00 inches (approximately 30.48 centimeters), approximately 17.72 inches (approximately 45.00 centimeters), or approximately 18.00 inches (approximately 45.72 centimeters). In some embodiments, the carrier substrate can be a panel, such as, for example, of approximately 300 millimeters by approximately 400 millimeters, of approximately 360 millimeters by approximately 465 millimeters, of approximately 370 millimeters by approximately 470 millimeters, of approximately 400 millimeters by approximately 500 millimeters, of approximately 550 millimeters by approximately 650 millimeters, of approximately 600 millimeters by approximately 720 millimeters, of approximately 620 millimeters by approximately 750 millimeters, of approximately 680 millimeters by approximately 880 millimeters, of approximately 730 millimeters by approximately 920 millimeters, of approximately 1100 millimeters by approximately 1250 millimeters, of approximately 1100 millimeters by approximately 1300 millimeters, of approximately 1500 millimeters by approximately 1800 millimeters, of approximately 1500 millimeters by approximately 1850 millimeters, of approximately 1870 millimeters by approximately 2200 millimeters, of approximately 1950 millimeters by approximately 2200 millimeters, of approximately 1950 millimeters by approximately 2250 millimeters, of approximately 2160 millimeters by approximately 2460 millimeters, of approximately 2200 millimeters by approximately 2500 millimeters, or of approximately 2880 millimeters by approximately 3130 millimeters. In some embodiments, the carrier substrate (e.g., the wafer or panel) can comprise a carrier substrate thickness. The carrier substrate thickness can refer to a dimension of the carrier substrate measured in a direction approximately perpendicular to the first and second surfaces of the carrier substrate. For example, the carrier substrate thickness can be greater than or equal to approximately 300 micrometers and less than or equal to approximately 2 millimeters. In these or other embodiments, the carrier substrate thickness can be greater than or equal to approximately 0.5 millimeter. In many embodiments, the carrier substrate thickness can be approximately constant. In many embodiments, the carrier substrate can comprise a wafer or panel of other dimensions.

Later, in some embodiments, activity 101 can comprise activity 1702 of cleaning the carrier substrate. In some embodiments, activity 1702 can comprise an activity of cleaning the carrier substrate with plasma (e.g., $O_2$ plasma). In these embodiments, cleaning the carrier substrate with $O_2$ plasma can increase the amount of oxygen at the carrier substrate, which can affect (e.g., increase or decrease) a first bond promoting layer-carrier substrate adhesion strength, a second bond promoting layer-carrier substrate adhesion strength, a hybrid bond promoting layer-carrier substrate adhesion strength, and/or a first device substrate-carrier substrate adhesion strength each of which is discussed in greater detail below, by increasing an amount of oxygen available to bond with the first bond promoting layer, the second bond promoting layer, the hybrid bond promoting layer, and/or the first device substrate, each of which is also discussed in greater detail below.

Then, activity 101 can comprise activity 1703 of polishing the first surface and/or the second surface of the carrier substrate. Polishing the surface of the carrier substrate (e.g., the first surface) that is not subsequently bonded with the first bond promoting layer and/or the second bond promoting layer, as described below, improves the ability of a vacuum or air chuck to handle the carrier substrate. Also, polishing the surface of the carrier substrate (e.g., the second surface) that is subsequently bonded to the first bond promoting layer and/or the second bond promoting layer, as described below, removes topological features at the surface of the carrier substrate that could cause roughness of the resulting device substrate assembly in the z-axis after the first device substrate and carrier substrate are coupled together.

Returning to FIG. 1, method 100 can comprise activity 102 of providing a first bond promoting layer over the carrier substrate (e.g., the second surface of the carrier substrate). In some embodiments, the first bond promoting layer can be provided over only a perimeter portion of the second surface of the carrier substrate, over substantially all of the second surface of the carrier substrate, or over all of the second surface of the carrier substrate. As explained in greater detail below, the first bond promoting layer can be operable to bond a first device substrate to the carrier substrate in order to couple the first device substrate to the carrier substrate.

In many embodiments, the perimeter portion of the second surface of the carrier substrate can refer to a portion of the second surface of the carrier substrate located between an edge of the carrier substrate and an interior perimeter of the second surface of the carrier substrate. Meanwhile, the interior perimeter can refer to a continuous reference line located at the second surface of the carrier substrate and all or at least a substantial portion (e.g., at least approximately 90 or 95 percent) of which is inset from the edge of the carrier substrate by a predetermined distance. The predetermined distance can be provided so as to be large enough to ensure a first device substrate bonded to the first bond promoting layer, as described below at activity 601 (FIG. 6), sufficiently overlaps the first bond promoting layer to prevent the first device substrate from de-bonding from the first bond promoting layer when one or more semiconductor elements are provided over the first device substrate as described below with respect to activity 109 (below). Further, the predetermined distance can be provided to be as small as possible, while still permitting the foregoing, to maximize a surface area of the first device substrate over which the one or more semiconductor elements can be provided in accordance with activity 109 (below). For example, the predetermined distance can be greater than or equal to approximately 100 micrometers and less than or equal to approximately 1 millimeter.

Meanwhile, the first bond promoting layer can comprise one or more first bond promoting layer materials. In these or other embodiments, the first bond promoting layer material (s) can comprise one or more material(s) able to bond to a first device substrate with a first device substrate-first bond promoting layer adhesion strength and/or able to bond to the carrier substrate with the first bond promoting layer-carrier substrate adhesion strength, as discussed in greater detail below.

Exemplary first bond promoting layer material(s) can comprise (3-Aminopropyl)triethoxysilane, 3-silane, Bis[3-(triethoxysilyl)propyl]amine, or 3-hexamethyldisilazane. In these embodiments, the first bond promoting layer material(s) can further comprise 1-methoxy-2-propanol or 2-methoxy-1-propanol. In some embodiments, the first bond promoting layer material(s) can comprise greater than or equal to approximately 0.0005 percent and less than or equal to approximately 0.1 percent (3-Aminopropyl)triethoxysilane, and can comprise greater than or equal to approximately 99.9995 percent and less than or equal to approximately 99.9 percent 1-methoxy-2-propanol; the first bond promoting layer material(s) can comprise greater than or equal to approximately 0.0005 percent and less than or equal to approximately 0.1 percent 3-Aminopropyl(diethoxy) methylsilane, and can comprise greater than or equal to approximately 99.9995 percent and less than or equal to approximately 99.9 percent 1-methoxy-2-propanol; or the first bond promoting layer material(s) can comprise greater than or equal to approximately 0.001 percent and less than or equal to approximately 0.1 percent Bis[3-(triethoxysilyl) propyl]amine, and can comprise greater than or equal to approximately 99.999 percent and less than or equal to approximately 99.9 percent 1-methoxy-2-propanol. Diluting the first bond promoting layer material(s) with 1-methoxy-2-propanol can vary (e.g., decrease) the first device substrate-first bond promoting layer adhesion strength and/or the first bond promoting layer-carrier substrate adhesion strength.

Figure 6:
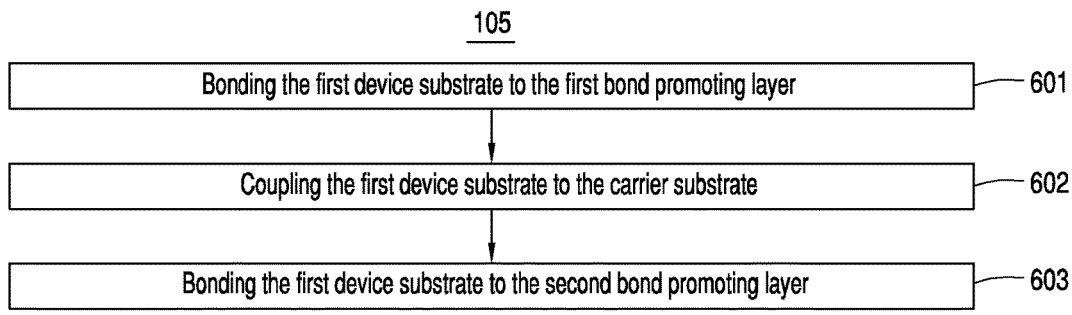
FIG. 6 illustrates an exemplary activity of depositing a first device substrate over the carrier substrate and the first bond promoting layer, according to the embodiment of FIG. 1.

Further, the first bond promoting layer can be provided to comprise a first bond promoting layer thickness (i.e., a dimension of the first bond promoting layer that is approximately perpendicular to the second surface of the carrier substrate when the first bond promoting layer is provided over the carrier substrate). In many embodiments, the first bond promoting layer thickness can be approximately constant. In some embodiments, the first bond promoting layer thickness can be greater than or equal to approximately one monolayer and less than or equal to approximately 1 micrometer. Generally, the first bond promoting layer thickness can be selected to be thick enough to ensure continuous distribution of the first bond promoting layer over the carrier substrate. Further, the first bond promoting layer thickness can be selected to be as thin as possible, while still permitting the foregoing, to minimize bowing, warping, and/or distortion of the first device substrate when the first device substrate is bonded to the first bond promoting layer, as described below at activity 601 (FIG. 6).

Figure 2:
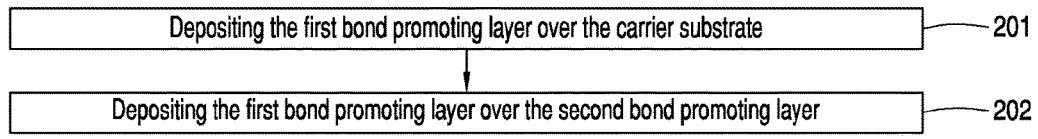
FIG. 2 illustrates an exemplary activity of providing a first bond promoting layer over a carrier substrate, according to the embodiment of FIG. 1.
Figure 3:
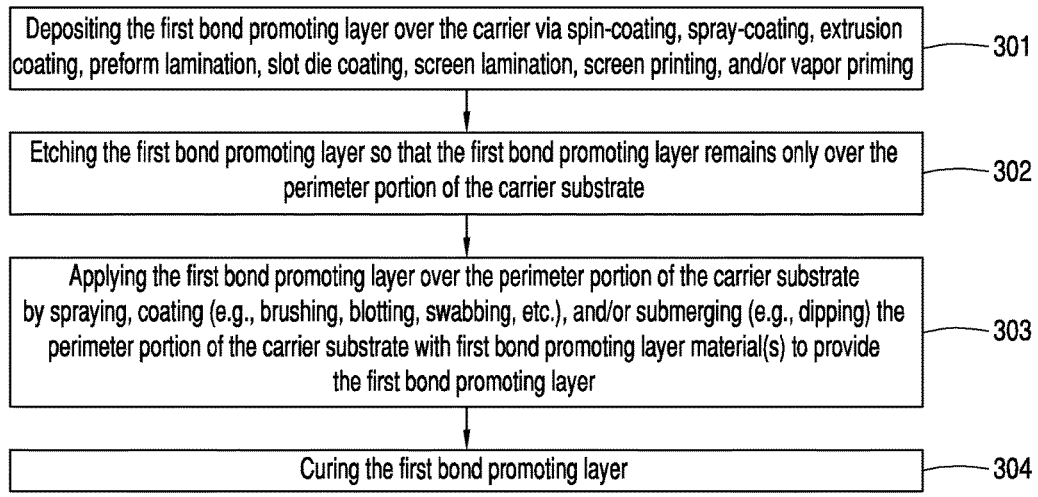
FIG. 3 illustrates an exemplary activity of depositing the first bond promoting layer over the carrier substrate, according to the embodiment of FIG. 1.

Turning ahead in the drawings, FIG. 2 illustrates an exemplary activity 102, according to the embodiment of FIG. 1. For example, activity 102 can comprise activity 201 of depositing the first bond promoting layer over the carrier substrate (e.g., the second surface of the carrier substrate), such as, for example, over a perimeter portion of the second surface of the carrier substrate, over substantially all of the second surface of the carrier substrate, or over all of the second surface of the carrier substrate. FIG. 3 illustrates an exemplary activity 201, according to the embodiment of FIG. 1.

For example, activity 201 can comprise activity 301 of depositing the first bond promoting layer over the carrier substrate (e.g., the second surface of the carrier substrate) via spin-coating, spray-coating, extrusion coating, preform lamination, slot die coating, screen lamination, screen printing, and/or vapor priming. For example, in many embodiments, the first bond promoting layer can be deposited over the carrier substrate (e.g., the second surface of the carrier substrate) under one or more predetermined conditions.

The predetermined conditions can be dependent on the manner of performing activity 301 and/or a desired first bond promoting layer thickness, as discussed above. In specific examples, such as, for example, when activity 301 is implemented by spin coating, the first bond promoting layer can be deposited while spinning the carrier substrate first at a spin rate of approximately 500 revolutions per minute for a time of approximately 10-100 seconds (e.g., 20 seconds). Then, the carrier substrate can be spun for a time of approximately 10-100 seconds (e.g., 20 seconds) at a spin rate greater than or equal to approximately 500 revolutions per minute and less than or equal to approximately 3000 revolutions per minute, such as, for example, to distribute the first bond promoting layer over the carrier substrate.

Further, activity 201 can comprise activity 302 of etching the first bond promoting layer so that the first bond promoting layer remains only over the perimeter portion of the carrier substrate. In these embodiments, activity 302 can be performed using any suitable resists and etchants compatible to mark and etch the first bond promoting layer material(s). In some embodiments, activity 302 can be omitted.

In other embodiments, activity 201 can comprise activity 303 of applying the first bond promoting layer over the perimeter portion of the carrier substrate by spraying, coating (e.g., brushing, blotting, swabbing, etc.), and/or submerging (e.g., dipping) the perimeter portion of the carrier substrate with the first bond promoting layer material(s) to provide the first bond promoting layer. In many embodiments, activity 301 and activity 302 can be omitted when activity 303 is performed, or vice versa.

In many embodiments, activity 201 can comprise activity 304 of curing the first bond promoting layer. In various embodiments, activity 304 can help to remove chemistry (e.g., solvents) from the first bond promoting layer used to perform activity 301 (above). In these or other embodiments, activity 304 can help to couple the first bond promoting layer to the carrier substrate (e.g., the second surface of the carrier substrate). The first bond promoting layer can be thermally cured and/or optically cured, as desirable.

Referring now back to FIG. 2, in many embodiments, activity 102 can comprise activity 202 of depositing the first bond promoting layer over a second bond promoting layer. In some embodiments, activity 202 can be performed as part of activity 201. In other embodiments, activity 202 can be omitted, such as, for example, when activity 103 (FIG. 1) is omitted or when activity 102 is performed before activity 103 (FIG. 1).

Referring now back to FIG. 1, method 100 can comprise activity 103 of providing the second bond promoting layer over the carrier substrate (e.g., the second surface of the carrier substrate). As explained in greater detail below, similar to the first bond promoting layer, the second bond promoting layer can be operable to bond the first device substrate to the carrier substrate in order to couple the first device substrate to the carrier substrate.

The second bond promoting layer can comprise one or more second bond promoting layer materials. In many embodiments, at least one of the second bond promoting layer material(s) can be different than at least one of the first bond promoting layer material(s). Exemplary second bond promoting layer material(s) can comprise 3-hexamethyldisilazane or Bis[3-(triethoxysilyl)propyl]amine. Further, in these or other embodiments, the second bond promoting layer material(s) can comprise one or more material(s) able to bond to the first device substrate with a first device substrate-second bond promoting layer adhesion strength and/or able to bond to the carrier substrate with a second bond promoting layer-carrier substrate adhesion strength, as explained in greater detail below.

Further, the second bond promoting layer can be provided to comprise a second bond promoting layer thickness (i.e., a dimension of the second bond promoting layer that is approximately perpendicular to the second surface of the carrier substrate when the second bond promoting layer is provided over the carrier substrate). In some embodiments, the second bond promoting layer thickness can be approximately constant. In some embodiments, the second bond promoting layer thickness can be greater than or equal to approximately one monolayer. In further embodiments, the second bond promoting layer thickness can be less than or equal to approximately five monolayers. Generally, the second bond promoting layer thickness can be provided to be thick enough to ensure continuous distribution of the second bond promoting layer over the carrier substrate. Further, the second bond promoting layer thickness can be provided to be as thin as possible, while still permitting the foregoing. In some embodiments, providing the second bond promoting layer to be as thin as possible, while still permitting the foregoing, can minimize bowing, warping, and/or distortion of the first device substrate when the first device substrate is bonded to the second bond promoting layer, as explained below at activity 603 (FIG. 4).

In many embodiments, activity 103 can be performed before activity 102, or vice versa. In other embodiments, activity 103 can be omitted.

Figure 4:
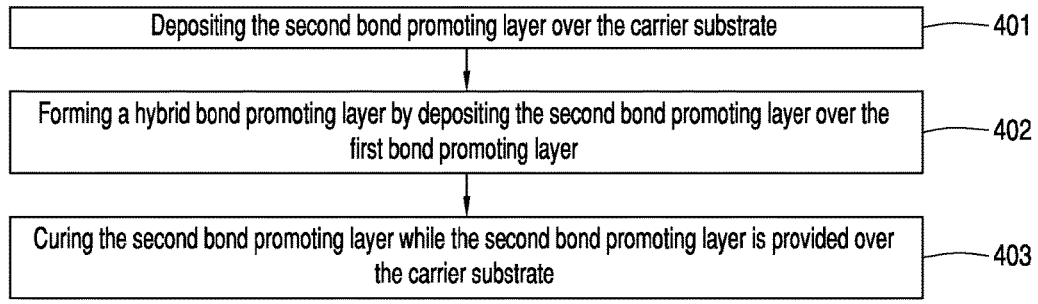
FIG. 4 illustrates an exemplary activity of providing a second bond promoting layer over the carrier substrate, according to the embodiment of FIG. 1.
Figure 5:
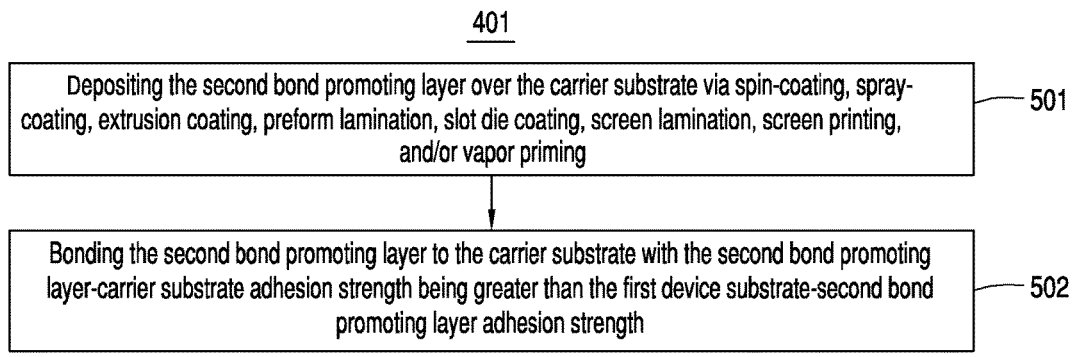
FIG. 5 illustrates an exemplary activity depositing the second bond promoting layer over the carrier substrate, according to the embodiment of FIG. 1.

Turning ahead in the drawings, FIG. 4 illustrates an exemplary activity 103, according to the embodiment of FIG. 1. For example, activity 103 can comprise activity 401 of depositing the second bond promoting layer over the carrier substrate (e.g., over the second surface of the carrier substrate). FIG. 5 illustrates an exemplary activity 401, according to the embodiment of FIG. 1.

In many embodiments, activity 401 can comprise activity 501 of depositing the second bond promoting layer over the carrier substrate (e.g., the second surface of the carrier substrate) via spin-coating, spray-coating, extrusion coating, preform lamination, slot die coating, screen lamination, screen printing, and/or vapor priming. For example, in many embodiments, the second bond promoting layer can be deposited over the carrier substrate (e.g., the second surface of the carrier substrate) under one or more predetermined conditions. The predetermined conditions can be dependent on the manner of implementing activity 501 and/or a desired second bond promoting layer thickness, as discussed above.

In specific examples, such as, for example, when activity 501 is implemented by spin coating, the second bond promoting layer can be deposited while spinning the carrier substrate first at a spin rate of approximately 500 revolutions per minute for a time of approximately 10-100 seconds (e.g., 20 seconds). Then, the carrier substrate can be spun for a time of approximately 10-100 seconds (e.g., 20 seconds) at a spin rate greater than or equal to approximately 500 revolutions per minute and less than or equal to approximately 3000 revolutions per minute, such as, for example, to distribute the second bond promoting layer over the carrier substrate. In other examples, such as, for example, when activity 501 is implemented by vapor priming, the vapor priming can be performed at a temperature of less than or equal to approximately 125° C. and less than or equal to approximately 150° C.

In these embodiments, activity 401 can comprise activity 502 of bonding the second bond promoting layer to the carrier substrate with the second bond promoting layer-carrier substrate adhesion strength being greater than the first device substrate-second bond promoting layer adhesion strength, as explained in greater detail below. In many embodiments, activity 502 can be performed as part of activity 501.

Referring now back to FIG. 4, in some embodiments, activity 103 can comprise activity 402 of forming a hybrid bond promoting layer by depositing the second bond promoting layer over the first bond promoting layer. In some embodiments, activity 402 can be performed as part of activity 401. In other embodiments, activity 402 can be omitted, such as, for example, when activity 103 is performed before activity 102.

In some embodiments, the hybrid bond promoting layer can be formed due to at least partial mixing together of the first bond promoting layer and the second bond promoting layer when the second bond promoting layer is deposited over the first bond promoting layer. In other embodiments, first bond promoting layer and second bond promoting layer can remain discretely stacked within the hybrid bond promoting layer. Notably, in some embodiments, when the hybrid bond promoting layer is formed by partial mixing together of the first bond promoting layer and the second bond promoting layer, at least some of the activities of method 100 performed with respect to the first bond promoting layer can be performed instead with respect to the hybrid bond promoting layer, such as, for example, activity 106 and/or activity 107 (below).

Regardless, when activity 402 is performed, activity 601 (FIG. 6) of bonding the first device substrate to the first bond promoting layer can comprise bonding the first device substrate with the hybrid bond promoting layer. Accordingly, the first device substrate can bond to the hybrid bond promoting layer with a first device substrate-hybrid bond promoting layer adhesion strength, and/or the hybrid bond promoting layer can bond to the carrier substrate with a hybrid bond promoting layer-carrier substrate adhesion strength. In these embodiments, the first device substrate-first bond promoting layer adhesion strength can dominate the first device substrate-second bond promoting layer adhesion strength, and/or the first bond promoting layer-carrier substrate adhesions strength can dominate the second bond promoting layer-carrier substrate adhesion strength. Accordingly, the first device substrate-hybrid bond promoting layer adhesion strength can be approximately equal to the first device substrate-first bond promoting layer adhesion strength, and/or the hybrid bond promoting layer-carrier substrate adhesion strength can be approximately equal to the first bond promoting layer-carrier substrate adhesion strength. For example, in these embodiments, the first device substrate-hybrid bond promoting layer adhesion strength can be greater than or equal to approximately 99 percent of the first device substrate-first bond promoting layer adhesion strength, and/or the hybrid bond promoting layer-carrier substrate adhesion strength can be greater than or equal to approximately 99 percent of the first bond promoting layer-carrier substrate adhesion strength. As a result, even when the second bond promoting layer is deposited over the first bond promoting layer, as in activity 402, the resulting bond between the first device substrate and the hybrid bond promoting layer can be similar to when the first device substrate directly bonds to the first bond promoting layer (e.g., when activity 102 (FIG. 1) comprises activity 202 (FIG. 2)) because the first device substrate-hybrid bond promoting layer adhesion strength can be approximately equal to the first device substrate-first bond promoting layer adhesion strength.

Further, in many embodiments, activity 103 can comprise activity 403 of curing the second bond promoting layer while the second bond promoting layer is provided over the carrier substrate. In various embodiments, activity 304 can help to remove from the second bond promoting layer chemistry (e.g., solvents) used to perform activity 401 (above). In these or other embodiments, activity 403 can help to couple (e.g., bond) the second bond promoting layer to the carrier substrate (e.g., the second surface of the carrier substrate). The second bond promoting layer can be thermally cured and/or optically cured, as desirable.

Referring again to FIG. 1, method 100 can comprise activity 104 of curing the first bond promoting layer and/or the second bond promoting layer while the first bond promoting layer and/or the second bond promoting layer are provided over the carrier substrate. In these or other embodiments, activity 705 can help to couple the first bond promoting layer and/or the second bond promoting layer to the carrier substrate. The first bond promoting layer and/or the second bond promoting layer can be thermally cured and/or optically cured, as desirable. For example, in some embodiments, the first bond promoting layer and/or the second bond promoting layer can be thermally cured in open air conditions, at a temperature of greater than or equal to approximately room temperature and less than or equal to approximately 200° C., and/or for a time of approximately 3 minutes. In further embodiments, the temperature can be greater than or equal to approximately 80° C. and less than or equal to approximately 120° C. For example, the temperature can comprise approximately 100° C. In some embodiments, activity 403 can be omitted. In further embodiments, one of activity 304 or activity 403 can be performed as part of activity 104. That is, in these embodiments, activity 104 can replace the one of activity 304 or activity 403.

Referring again back to FIG. 1, method 100 can comprise activity 105 of depositing a first device substrate over the carrier substrate and the first bond promoting layer. The first device substrate is configured to bond to the carrier substrate with a first device substrate-carrier substrate adhesion strength.

In many embodiments, the first device substrate can comprise a flexible substrate. The first device substrate (e.g., flexible substrate) can comprise one or more first device substrate materials. Exemplary first device substrate material(s) can comprise one or more organic materials (e.g., polyimide, polyamide, paraffin, parylene, polydimethylsiloxane, epoxy, etc.). Implementing the device substrate to comprise polyimide and/or polyamide can be advantageous because polyimide and polyamide can be made very thin, can be rugged, and can be substantially inert to semiconductor manufacturing chemistries and/or biological chemistries. Further, in these or other embodiments, the first device substrate material(s) can comprise one or more material(s) able to bond to the first bond promoting layer with the first device substrate-first bond promoting layer adhesion strength, to the carrier substrate with the first device substrate-carrier substrate adhesion strength, and when applicable, to the second bond promoting layer with the first device substrate-second bond promoting layer adhesion strength, as explained in greater detail below.

Further, the first device substrate can be provided to comprise a first device substrate thickness (i.e., a dimension of the first device substrate that is approximately perpendicular to the second surface of the carrier substrate when the first device substrate is provided over the carrier substrate). In some embodiments, the first device substrate can be approximately constant. In some embodiments, the first device substrate thickness can be greater than or equal to approximately 0.5 micrometer and less than or equal to approximately 150 micrometers. For example, the first device substrate thickness can be approximately 5, 12, or 20 micrometers. Generally, the first device substrate can be provided to be thick enough to ensure continuous distribution of the first device substrate over the carrier substrate. Further, the first device substrate thickness can be provided to be as thin as possible, while still permitting the foregoing, to minimize bowing, warping, and/or distortion of the first device substrate when the first device substrate is bonded to the first bond promoting layer and/or the second bond promoting layer, as described below at activity 601 (FIG. 6) and/or activity 603 (FIG. 6).

In some embodiments, the first device substrate can be deposited over the carrier substrate and the first bond promoting layer via spin-coating, spray-coating, extrusion coating, preform lamination, slot die coating, screen lamination, screen printing, and/or vapor priming. For example, in many embodiments, the first device substrate can be deposited over the carrier substrate and the first bond promoting layer under one or more predetermined conditions. The predetermined conditions can be dependent on the manner of performing activity 105 and/or a desired first device substrate thickness, as discussed above.

In specific examples, when activity 105 is implemented by spin coating, the first device substrate can be deposited while spinning the carrier substrate first at a spin rate of approximately 500 revolutions per minute for a time of approximately 10-100 seconds (e.g., 20 seconds). Then, the carrier substrate can be spun for a time of approximately 10-100 seconds (e.g., 20 seconds) at a spin rate greater than or equal to approximately 500 revolutions per minute and less than or equal to approximately 3000 revolutions per minute, such as, for example, to distribute the first device substrate over the carrier substrate. For example, the carrier substrate can be spun at 1000 revolutions per minute after spinning the carrier substrate at 500 revolutions per minute. In further examples, when activity 105 is implemented by slot die coating, the slot die coating can be performed with a coating gap of approximately 200 micrometers, with a coating velocity of approximately 10 millimeters per second, at a dispense rate of approximately 730 microliters per second, and with a shim size of approximately 10 mils (approximately 0.254 millimeter).

Turning ahead in the drawings, FIG. 6 illustrates an exemplary activity 105, according to the embodiment of FIG. 1. For example, activity 104 can comprise activity 601 of bonding the first device substrate to the first bond promoting layer. In these embodiments, the first device substrate bonds to the first bond promoting layer with the first device substrate-first bond promoting layer adhesion strength being greater than the first device substrate-carrier substrate adhesion strength or bonds to the hybrid bond promoting layer with the first device substrate-hybrid bond promoting layer adhesion strength being greater than the first device substrate-carrier substrate adhesion strength. In these or other embodiments, the first device substrate-first bond promoting layer adhesion strength or the first device substrate-hybrid bond promoting layer adhesion strength can be at least two, three, or five times greater than the first device substrate-carrier substrate adhesion strength.

Further, activity 104 can comprise activity 602 of coupling the first device substrate to the carrier substrate. In some embodiments, activity 602 can comprise bonding the first device substrate to the carrier substrate, such as, for example, when activity 103 is omitted. In these embodiments, the first device substrate bonds to the carrier substrate with the first device substrate-carrier substrate adhesion strength being less than the first device substrate-first bond promoting layer adhesion strength or the first device substrate-hybrid bond promoting layer adhesion strength.

In some embodiments, activity 104 can comprise activity 603 of bonding the first device substrate to the second bond promoting layer, such as, for example, when method 100 comprises activity 103. In these embodiments, the first device substrate bonds to the second bond promoting layer with the first device substrate-second bond promoting layer adhesion strength. Further, in some embodiments, the first device substrate-second bond promoting layer adhesion strength can be greater than the first device substrate-carrier substrate adhesion strength, and less than the first device substrate-first bond promoting layer adhesion strength or the first device substrate-hybrid bond promoting layer adhesion strength. In some embodiments, activity 603 can be omitted, such as, for example, when activity 103 is omitted.

In many embodiments, activity 602 can be performed approximately simultaneously with activity 601 and/or activity 603. Further, in some embodiments, activity 601 and/or activity 603 can be performed as part of activity 602, and vice versa.

As introduced briefly above, in many embodiments, activity 105 can permit the first device substrate to be coupled to the carrier substrate. In these or other embodiments, the first device substrate-carrier substrate adhesion strength can be sufficiently low that the first device substrate could become decoupled from the carrier substrate when one or more semiconductor elements are provided over the first device substrate as described below with respect to activity 109 (FIG. 1). In these embodiments, the first device substrate can be referred to as a low adhesion strength device substrate. For example, in some embodiments, implementing the first device substrate of certain first device substrate material(s) (e.g., polyimide or polyamide) may be desirable for certain reasons (e.g., desirable flexibility, strength, transparency, etc.) where those first device substrate material(s) also result in the first device substrate-carrier substrate adhesion strength being undesirably low.

Accordingly, in many embodiments, the first device substrate-first bond promoting layer adhesion strength or the first device substrate-hybrid bond promoting layer adhesion strength can be greater than the first device substrate-carrier substrate adhesion strength. In these or other embodiments, the first device substrate-first bond promoting layer adhesion strength or the first device substrate-hybrid bond promoting layer adhesion strength can be sufficiently great to couple the first device substrate to the carrier substrate in a manner that the first device substrate will not unintentionally become decoupled from the carrier substrate when one or more semiconductor elements are provided over the first device substrate as described below with respect to activity 109 (FIG. 1). As a result, formation of run-out printing errors during activity 109 (FIG. 1) can be avoided. Further, providing the first bond promoting layer over only the perimeter portion of the carrier substrate can aid in performing activity 110 (FIG. 1) and/or activity 111 (FIG. 1), as discussed below. In some embodiments, the first bond promoting layer-carrier substrate adhesion strength can be greater than the first device substrate-first bond promoting layer adhesion strength; and/or the hybrid bond promoting layer-carrier substrate adhesion strength can be greater than the first device substrate-hybrid bond promoting layer adhesion strength.

Meanwhile, when activity 103 (above) is implemented, the first device substrate-second bond promoting layer adhesion strength can be greater than the first device substrate-carrier substrate adhesion strength to further assist in keeping the first device substrate coupled to the carrier substrate when the semiconductor element(s) are provided over the first device substrate. For example, when the first bond promoting layer is over only the perimeter portion, the first device substrate can remain coupled to the carrier substrate at the perimeter portion but may still decouple from the carrier substrate inside the perimeter portion when the first device substrate-carrier substrate adhesion strength is sufficiently low. In these examples, the second bonding layer can be provided via activity 103 (FIG. 1) to ensure the first device substrate remains coupled to the carrier substrate inside of the perimeter portion when the semiconductor element(s) are provided over the first device substrate. However, in these embodiments, the first device substrate-second bond promoting layer adhesion strength can also be sufficiently less than the first device substrate-first bond promoting layer adhesion strength so that the first device substrate-second bond promoting layer adhesion strength does not prevent the first device substrate from being decoupled from the carrier substrate at activity 110 (FIG. 1), and sufficiently less than the second bond promoting layer adhesion strength-carrier substrate adhesion strength to permit the first device substrate to decouple from the second bond promoting layer when activity 110 (FIG. 1) is performed.

In many embodiments, the adhesion strength of the first device substrate-carrier substrate adhesion strength, the first bond promoting layer-carrier substrate adhesion strength, the second bond promoting layer-carrier substrate adhesion strength, the first device substrate-first bond promoting layer adhesion strength, the first device substrate-second bond promoting layer adhesion strength, and/or the first device substrate-hybrid bond promoting layer adhesion strength can refer to a tensile adhesion strength and/or a peel adhesion strength.

In many examples, tensile adhesion strength can be measured by depositing and/or bonding a layer of a first test material (e.g., a material of the first device substrate, the first bond promoting layer, the second bond promoting layer, or the hybrid bond promoting layer) to a layer of a second test material (e.g., the material of the first bond promoting layer, the second bond promoting layer, the hybrid bond promoting layer, or the carrier substrate, as applicable). In some of these examples, the layer of the first test material can be cured. Meanwhile, a test area of the layer of the first material can be bonded to a vertical force test instrument, such as, an MX-275 motorized vertical force test instrument manufactured by IMADA, Incorporated of Northbrook, Ill., United States of America. More specifically, the test area can be bonded to a test block of the vertical force test instrument. In many examples, the test area can comprise a 1 centimeter square area of the layer of the first test material, and/or the test area can be isolated (e.g., cut) from a remainder of the layer of the first material (e.g., with a razor blade). In further examples, a cyanoacrylate adhesive or polyurethane adhesive can be implemented to bond the test area to the test block. After the adhesive is allowed to cure (e.g., for 24 hours), the vertical force test instrument can be used with a force gauge to measure a peak force acting on the layer of the first material as the vertical force test instrument pulls on the test area. The force gauge can comprise a DS2-44 force gauge manufactured by IMADA, Incorporated of Northbrook, Ill., United States of America.

In further examples, peel adhesion strength can be measured by depositing and/or bonding a layer of a first test material (e.g., a material of the first device substrate, the first bond promoting layer, the second bond promoting layer, or the hybrid bond promoting layer) to a layer of a second test material (e.g., the material of the first bond promoting layer, the second bond promoting layer, the hybrid bond promoting layer, or the carrier substrate, as applicable). In some of these examples, the layer of the first test material can be cured. A strip of the layer of the first material can be cut into the layer (e.g., with a razor blade). For example, the layer can be approximately 2.54 centimeters wide. After cutting out the strip, a portion of the strip at the edge of the layer of the first material can be released by mechanical means (e.g., by a razor blade) from the layer of the second material. The released portion can be clamped to a vertical force test instrument, and the vertical force test instrument can be used with a force gauge to determine a peak force acting on the strip of the layer of the first material as the vertical force test instrument pulls (e.g., continuously) on the strip. In many examples, the vertical force test instrument can comprise an MX-275 motorized vertical force test instrument manufactured by IMADA, Incorporated of Northbrook, Ill., United States of America, and/or the force gauge can comprise a DS2-44 force gauge manufactured by IMADA, Incorporated of Northbrook, Ill., United States of America.

In many embodiments, the first device substrate can comprise the low adhesion strength device substrate when the first device substrate-carrier substrate adhesion strength comprises a tensile adhesion strength less than approximately 0.0390 MegaPascal. Meanwhile, in many embodiments, the first device substrate can comprise the low adhesion strength device substrate when the first device substrate-carrier substrate adhesion strength comprises a peel adhesion strength less than approximately 0.0100 kilogram per centimeter.

In some embodiments, the first device substrate-first bond promoting layer adhesion strength can comprise a tensile adhesion strength greater than or equal to approximately 0.0390 MegaPascal and less than or equal to approximately 0.400 MegaPascal, and/or a peel adhesion strength greater than or equal to approximately 0.0100 kilogram per centimeter and less than or equal to approximately 0.0800 kilogram per centimeter. In these or other embodiments, the first bond promoting layer-carrier substrate adhesion strength can comprise a tensile adhesion strength greater than or equal to approximately 0.490 MegaPascal and less than or equal to approximately 0.785 MegaPascal, and/or a peel adhesion strength greater than or equal to approximately 0.0800 kilogram per centimeter and less than or equal to approximately 0.800 kilogram per centimeter.

In further embodiments, the first device substrate-second bond promoting layer adhesion strength can comprise a tensile adhesion strength greater than or equal to approximately 0.0390 MegaPascal and less than or equal to approximately 0.400 MegaPascal, and/or a peel adhesion strength greater than or equal to approximately 0.0100 kilogram per centimeter and less than or equal to approximately 0.0800 kilogram per centimeter. In these or other embodiments, the second bond promoting layer-carrier substrate adhesion strength can comprise a tensile adhesion strength greater than or equal to approximately 0.490 MegaPascal and less than or equal to approximately 0.785 MegaPascal, and/or a peel adhesion strength greater than or equal to approximately 0.0800 kilogram per centimeter and less than or equal to approximately 0.800 kilogram per centimeter.

Figure 7:
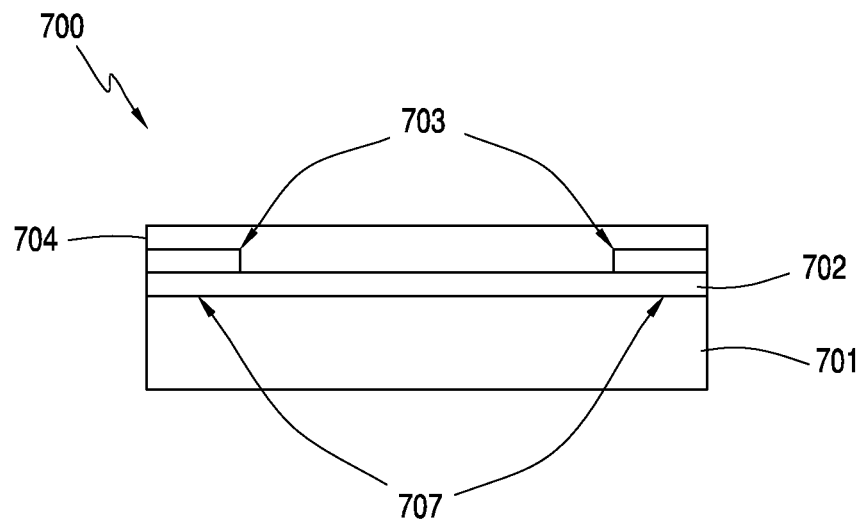
FIG. 7 illustrates a partial cross-sectional view of an electronic device after providing a second bond promoting layer over a carrier substrate and after providing a first bond promoting layer over a perimeter portion of the carrier substrate, in that order, and further after depositing a first device substrate over the second bond promoting layer, the first bond promoting layer, and the carrier substrate, according to an embodiment.

Turning ahead in the drawings, FIG. 7 illustrates a partial cross-sectional view of electronic device 700 after providing second bond promoting layer 702 over carrier substrate 701 and after providing first bond promoting layer 703 over perimeter portion 707 of carrier substrate 701, in that order, and further after depositing first device substrate 704 over second bond promoting layer 702, first bond promoting layer 703, and carrier substrate 701, according to an embodiment. Electronic device 700 can be similar or identical to the electronic device of method 100 (FIG. 1). Further, carrier substrate 701 can be similar or identical to the carrier substrate of method 100 (FIG. 1); second bond promoting layer 702 can be similar or identical to the second bond promoting layer of method 100 (FIG. 1); first bond promoting layer 703 can be similar or identical to the first bond promoting layer of method 100 (FIG. 1); perimeter portion 707 can be similar or identical to the perimeter portion of method 100 (FIG. 1); and/or first device substrate 704 can be similar or identical to the first device substrate of method 100 (FIG. 1).

Figure 8:
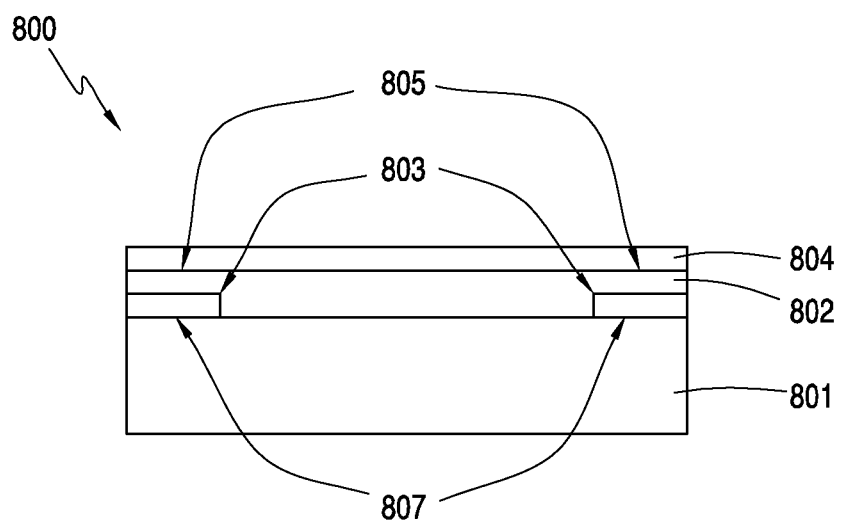
FIG. 8 illustrates a partial cross-sectional view of an electronic device after providing a first bond promoting layer over a perimeter portion of a carrier substrate and after providing a second bond promoting layer over the carrier substrate, in that order, to form a hybrid bond promoting layer and further after depositing a first device substrate over the second bond promoting layer, the first bond promoting layer, the hybrid bond promoting layer, and the carrier substrate, according to an embodiment.

Meanwhile, FIG. 8 illustrates a partial cross-sectional view of electronic device 800 after providing first bond promoting layer 803 over perimeter portion 807 of carrier substrate 801 and after providing second bond promoting layer 802 over carrier substrate 801, in that order, to form hybrid bond promoting layer 805 and further after depositing first device substrate 804 over second bond promoting layer 802, first bond promoting layer 803, hybrid bond promoting layer 805, and carrier substrate 801, according to an embodiment. Electronic device 800 can be similar or identical to the electronic device of method 100 (FIG. 1) and/or similar to electronic device 700 (FIG. 7). Further, carrier substrate 801 can be similar or identical to the carrier substrate of method 100 (FIG. 1) and/or similar to carrier substrate 701 (FIG. 7); second bond promoting layer 802 can be similar or identical to the second bond promoting layer of method 100 (FIG. 1) and/or second bond promoting layer 702 (FIG. 7); first bond promoting layer 803 can be similar or identical to the first bond promoting layer of method 100 (FIG. 1) and/or first bond promoting layer 703 (FIG. 7); perimeter portion 807 can be similar or identical to the perimeter portion of method 100 (FIG. 1); and/or first device substrate 804 can be similar or identical to the first device substrate of method 100 (FIG. 1) and/or first device substrate 704 (FIG. 7). Meanwhile, hybrid bond promoting layer 805 can be similar or identical to the hybrid bond layer described above with respect to method 100 (FIG. 1).

Referring again back to FIG. 1, method 100 can comprise activity 106 of curing the first device substrate and the first bond promoting layer and/or the second bond promoting layer while the first device substrate is bonded to the first bond promoting layer and/or the second bond promoting layer to couple the first device substrate to the carrier substrate. The first device substrate and the first bond promoting layer and/or the second bond promoting layer can be thermally cured and/or optically cured, as desirable. For example, in many embodiments, the first device substrate and the first bond promoting layer and/or the second bond promoting layer can be thermally cured in open air conditions with a hot plate, at a temperature greater than or equal to approximately 80 or 95° C., and/or for a time of greater than or equal to approximately 15 minutes. In further embodiments, the temperature can be greater than or equal to approximately 120° C. Meanwhile, in other embodiments, the first device substrate and the first bond promoting layer and/or the second bond promoting layer can be thermally cured in open air conditions for approximately 12 hours. In many embodiments, activity 106 can be performed after activity 105.

In many embodiments, performing activity 106 can help outgas a solvent (at least approximately 75 percent of the solvent) from the first device substrate. Removing the solvent from the first device substrate can prevent the first device substrate from bubbling or blistering during activity 107 (below).

Further, method 100 can comprise activity 107 of curing the first device substrate and the first bond promoting layer and/or the second bond promoting layer while the first device substrate is bonded to the first bond promoting layer and/or the second bond promoting layer to couple the first device substrate to the carrier substrate. The first device substrate and the first bond promoting layer and/or the second bond promoting layer can be thermally cured and/or optically cured, as desirable. For example, in many embodiments, the first device substrate and the first bond promoting layer and/or the second bond promoting layer can be thermally cured in low oxygen conditions with an oven, at a temperature greater than or equal to approximately 200° C. or 300° C. and less than or equal to approximately 375° C. or 450° C., and/or for a time of greater than or equal to approximately 1 hour. In many embodiments, the temperature can be approximately 10° C. greater than a highest temperature implemented during activity 109 (below). Further, the low oxygen conditions can be provided in a chamber with a nitrogen purge of oxygen down to less than or equal to approximately 100 parts per million. In various embodiments, performing activity 107 in the low oxygen conditions can prevent or mitigate the first device substrate from becoming more brittle and/or from becoming more opaque. In many embodiments, activity 107 can be performed after activity 105 and/or activity 106. In further embodiments, activity 106 and/or activity 107 can be performed as part of activity 105, activity 601 (FIG. 6), activity 602 (FIG. 6), and/or activity 603 (FIG. 6). Notably, in many embodiments, as the maximum temperature at which activity 107 is increased, the first device substrate-first bond promoting layer adhesion strength, the first device substrate-second bond promoting layer adhesion strength, the first device substrate-hybrid bond promoting layer adhesion strength, the first bond promoting layer-carrier substrate adhesion strength, the second bond promoting layer-carrier substrate adhesion strength, and/or the hybrid bond promoting layer-carrier substrate adhesion strength can increase.

In some embodiments, activity 106 can be omitted. In these embodiments, activity 107 can be implemented as a thermal cure, and the temperature ramp rate can be limited to approximately 1 or 2° C. per minute. Meanwhile, temperature hold times of at least a certain quantity of time (e.g., 30 minutes) can be performed at certain predetermined temperatures (e.g., 100° C., 200° C., etc.) of the thermal cure. In some embodiments, regulating the temperature ramp rate and/or the implementing the temperature hold times can mitigate or eliminate bubbling or blistering of the first device substrate resulting from solvent outgassing from the first device substrate without needing to first perform activity 106 by letting the solvent outgas slowly.

In some embodiments, method 100 can comprise activity 108 of depositing a second device substrate over the first device substrate (e.g., to couple the second device substrate to the carrier substrate). For example, activity 108 can comprise an activity of bonding the second device substrate to the first device substrate. In these embodiments, activity 108 can be performed similarly or identically to activity 105 but with respect to the second device substrate.

In further embodiments, the second device substrate can be configured to bond to the carrier substrate with a second device substrate-carrier substrate adhesion strength greater than the first device substrate-carrier substrate adhesion strength. The second device substrate can be similar to the first device substrate. For example, the second device substrate can comprise one or more second device substrate material(s) and/or a second device substrate thickness. However, in some embodiments, at least one material of the second device substrate material(s) can be different than at least one material of the first device substrate material(s) and/or the second device substrate thickness can be different than the first device substrate thickness. Thus, in many embodiments, although the second device substrate-carrier substrate adhesion strength can be greater than the first device substrate-carrier substrate adhesion strength, and in some embodiments, the second device substrate-carrier substrate adhesion strength can be sufficiently great to maintain a bond with the carrier substrate when one or more semiconductor elements are provided over the second device substrate, the first device substrate can have other material properties that are desirable that the second device substrate may not have, and vice versa. As a result, activity 108 can be performed to obtain the desired advantages of both the first device substrate and the second device substrate. In other embodiments, activity 108 can be omitted.

Figure 9:
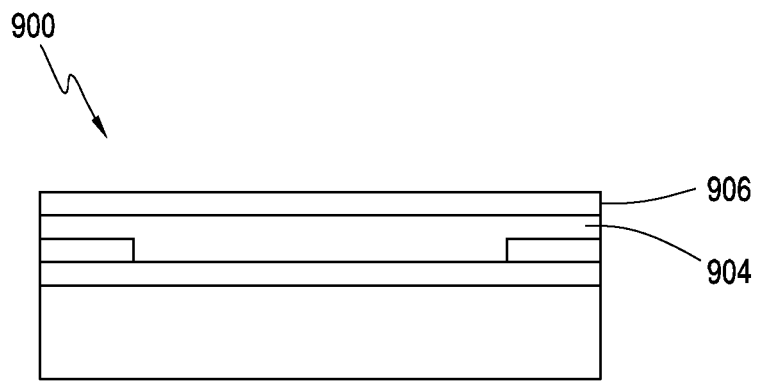
FIG. 9 illustrates a partial cross-sectional view of an electronic device after providing a second device substrate over a first device substrate, according to an embodiment.
Figure 10:
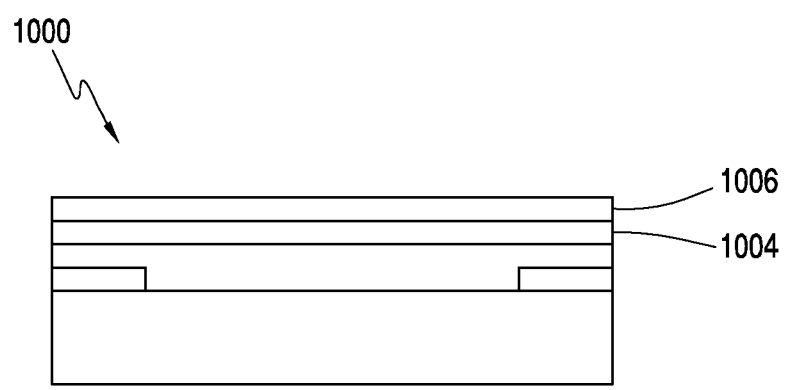
FIG. 10 illustrates a partial cross-sectional view of an electronic device after providing a second device substrate over a first device substrate, according to an embodiment.

Turning ahead in the drawings, FIG. 9 illustrates a partial cross-sectional view of electronic device 900 after providing second device substrate 906 over first device substrate 904, according to an embodiment. Meanwhile, FIG. 10 illustrates a partial cross-sectional view of electronic device 1000 after providing second device substrate 1006 over first device substrate 1004, according to an embodiment. Electronic device 900 can be similar or identical to the electronic device described above with respect to method 100 (FIG. 1) and/or to semiconductor 700 (FIG. 7); and/or electronic device 1000 can be similar or identical to the electronic device described above with respect to method 100 (FIG. 1) and/or to semiconductor 800 (FIG. 8). Accordingly, first device substrate 904 can be similar or identical to the first device substrate described above with respect to method 100 (FIG. 1) and/or to first device substrate 704 (FIG. 7); and/or first device substrate 1004 can be similar or identical to the first device substrate described above with respect to method 100 (FIG. 1) and/or to first device substrate 804 (FIG. 8). Further, second device substrate 906 and/or second device substrate 1006 can be similar or identical to the second device substrate described above with respect to method 100 (FIG. 1) and/or to each other.

Referring again back to FIG. 1, method 100 can comprise activity 109 of providing one or more semiconductor elements (e.g., transistors, detectors, emitters, etc.) over the first device substrate and/or the second device substrate, as applicable (e.g., while the first device substrate and/or the second device substrate are coupled to the carrier substrate). In some embodiments, the semiconductor element(s) can be provided over the first device substrate and/or the second device substrate in accordance with any conventional semiconductor manufacturing process that does not exceed a temperature of 365° C. or 450° C. In these or other embodiments, the semiconductor element(s) can be provided over the first device substrate and/or the second device substrate in accordance with any conventional semiconductor manufacturing process that does not exceed a temperature being at least approximately 10° C. less than a highest temperature implemented during activity 107 (above). In these or other embodiments, the semiconductor element(s) can be provided over the first device substrate and/or the second device substrate in accordance with any conventional semiconductor manufacturing process that does not exceed a temperature at which the first device substrate and/or the second device substrate would molecularly bond with the atmosphere. For example, in various embodiments, the semiconductor element(s) can be provided over the first device substrate and/or the second device substrate in accordance with the semiconductor manufacturing processes described in U.S. Pat. No. 8,999,778, US Patent Application Publication Serial No. US 2014/008651, and/or US Patent Application Publication Serial No. US 2014/254113, each of which is incorporated herein by reference in its entirety. In some embodiments, activity 109 can be performed before activity 110 and/or activity 111.

Figure 11:
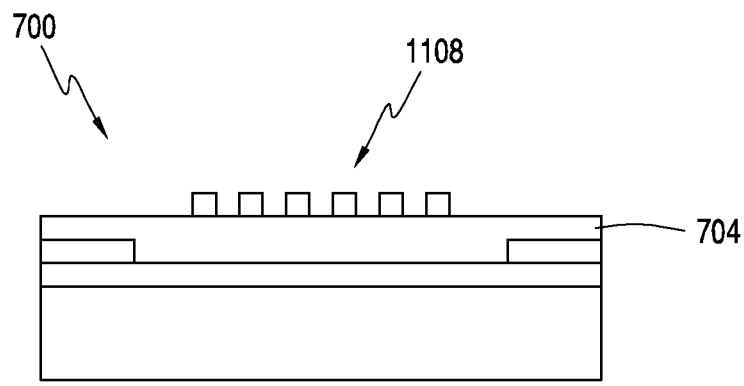
FIG. 11 illustrates a partial cross-sectional view of the electronic device after providing one or more semiconductor elements over the first device substrate, according to the embodiment of FIG. 7.
Figure 12:
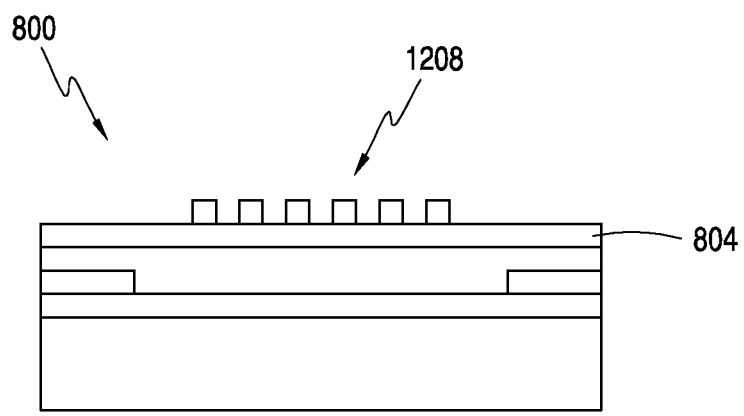
FIG. 12 illustrates a partial cross-sectional view of the electronic device after providing one or more semiconductor elements over first device substrate, according to the embodiment of FIG. 8.

Turning ahead in the drawings, FIG. 11 illustrates a partial cross-sectional view of electronic device 700 after providing one or more semiconductor elements 1108 over first device substrate 704, according to the embodiment of FIG. 7. Meanwhile, FIG. 12 illustrates a partial cross-sectional view of electronic device 800 after providing one or more semiconductor elements 1208 over first device substrate 804, according to the embodiment of FIG. 8. Semiconductor element(s) 1108 and/or semiconductor element(s) 1208 can be similar or identical to the semiconductor element(s) described above with respect to method 100 (FIG. 1) and/or to each other.

Referring again to FIG. 1, method 100 can comprise activity 110 of severing a device portion of the first device substrate and/or the second device substrate from a non-device portion of the first device substrate and/or the second device substrate (e.g., at a location inside the perimeter portion of the carrier substrate). The non-device portion of the first device substrate and/or the second device substrate can be bonded (e.g., directly for the first device substrate and via first device substrate for the second device substrate) to the first bond promoting layer or the hybrid bond promoting layer, and in some embodiments, the second bond promoting layer or the carrier substrate. Meanwhile, the device portion of the first device substrate and/or the second device substrate can be bonded (e.g., directly for the first device substrate and via first device substrate for the second device substrate) only to the second bond promoting layer or the carrier substrate. The device portion comprises at least part of the semiconductor element(s). In some embodiments, the non-device portion can comprise part of the semiconductor element(s). The device portion of the first device substrate and/or the second device substrate can be severed from the non-device portion of the first device substrate and/or the second device substrate using any suitable cutting implement (e.g., a blade, a laser, etc.). In many embodiments, activity 110 in FIG. 1 can be performed such that when activity 111 (below) is performed, some or all of the semiconductor element(s) remain with the device portion of the first device substrate and/or the second device substrate (e.g., leaving as little of the semiconductor element(s) behind with the non-device portion of the device substrate as possible). In many embodiments, activity 110 in FIG. 1 can occur after activity 108 (above). Further, activity 110 can occur before activity 111 (below).

In some embodiments, when the first bond promoting layer is provided over substantially all or all of the carrier substrate and/or when the first bond promoting layer comprises Bis[3-(triethoxysilyl)propyl]amine, activity 110 can be omitted. In these embodiments, the device portion of the first device substrate and/or the second device substrate for purposes of activity 111 (below) can be all of the first device substrate and/or the second device substrate.

Figure 13:
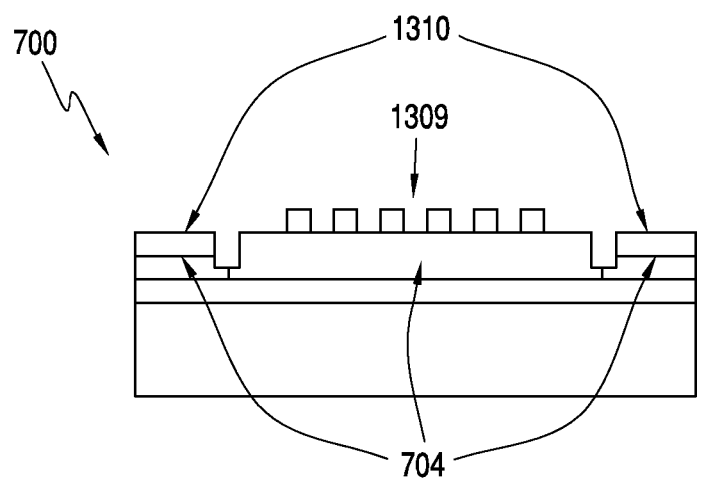
FIG. 13 illustrates a partial cross-sectional view of the electronic device after severing a device portion of the first device substrate from a non-device portion of the first device substrate, according to the embodiment of FIG. 7.
Figure 14:
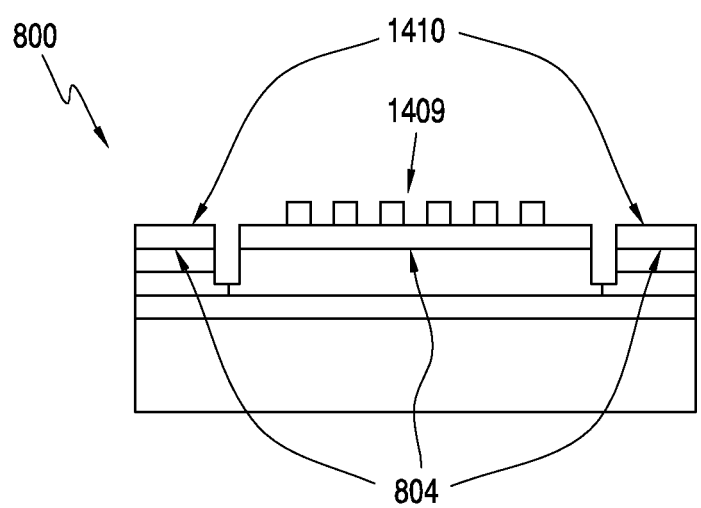
FIG. 14 illustrates a partial cross-sectional view of an electronic device after severing a device portion of the first device substrate from a non-device portion of the first device substrate, according to the embodiment of FIG. 8.

Turning ahead in the drawings, FIG. 13 illustrates a partial cross-sectional view of electronic device 700 after severing device portion 1309 of first device substrate 704 from non-device portion 1310 of first device substrate 704, according to the embodiment of FIG. 7. Meanwhile, FIG. 14 illustrates a partial cross-sectional view of electronic device 800 after severing device portion 1409 of first device substrate 804 from non-device portion 1410 of first device substrate 804, according to the embodiment of FIG. 8. In many embodiments, device portion 1309 and/or device portion 1409 can be similar or identical to the device portion described above with respect to method 100 (FIG. 1) and/or to each other; and/or non-device portion 1409 and/or non-device portion 1410 can be similar or identical to the device portion described above with respect to method 100 (FIG. 1) and/or to each other.

Figure 18:
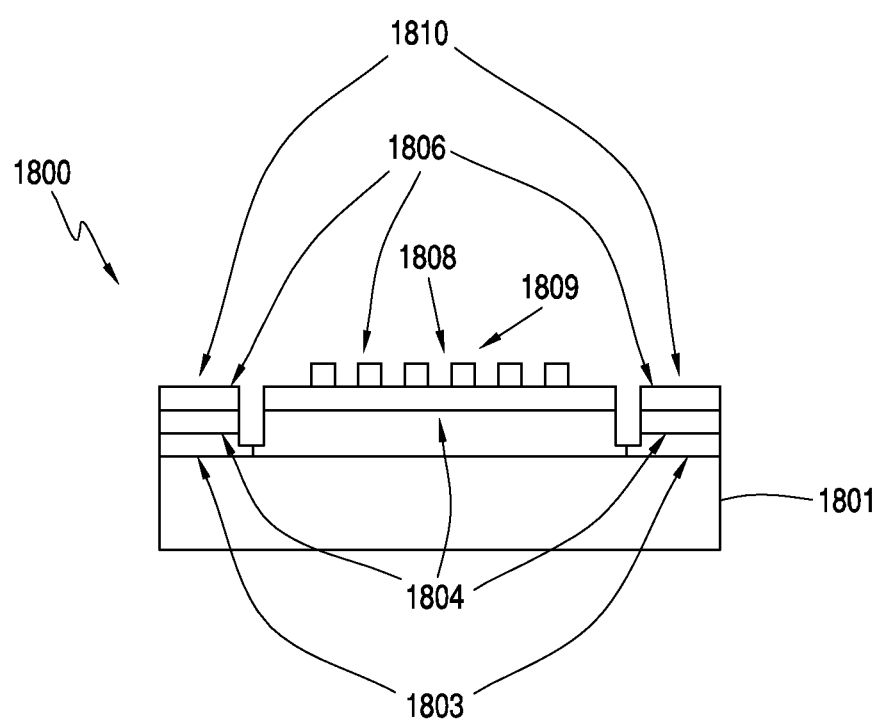
FIG. 18 illustrates a partial cross-sectional view of an electronic device after severing a device portion of a second device substrate and a first device substrate from a non-device portion of the second device substrate and the first device substrate where one or more semiconductor elements were provided over the second device substrate and where the second device substrate and the first device substrate were provided over a first bond promoting layer and a carrier substrate, according to an embodiment.

Meanwhile, skipping ahead in the drawings, FIG. 18 illustrates a partial cross-sectional view of an electronic device 1800 after severing device portion 1809 of second device substrate 1806 and first device substrate 1804 from non-device portion 1810 of second device substrate 1806 and first device substrate 1804 where one or more semiconductor elements 1808 were provided over second device substrate 1806 and where second device substrate 1806 and first device substrate 1804 were provided over first bond promoting layer 1803 and carrier substrate 1801, according to an embodiment. In these embodiments, electronic device 1800 can be similar to electronic device 700 (FIG. 7), electronic device 800 (FIG. 8), electronic device 900 (FIG. 9), and/or electronic device 1000 (FIG. 10), and/or can be similar or identical to the electronic device described above with respect to method 100 (FIG. 1). Accordingly, device portion 1809 can be similar or identical to the device portion described above with respect to system method 100 (FIG. 1) and/or can be similar to device portion 1309 (FIG. 13) and/or device portion 1409 (FIG. 14); non-device portion 1810 can be similar or identical to the non-device portion described above with respect to system method 100 (FIG. 1) and/or can be similar to device portion 1310 (FIG. 13) and/or device portion 1410 (FIG. 14); second device substrate 1806 can be similar or identical to the second device substrate described above with respect to method 100, to second device substrate 906 (FIG. 9), and/or to second device substrate 1006 (FIG. 10); first device substrate 1804 can be similar or identical to the first device substrate described above with respect to method 100, to first device substrate 704 (FIG. 7), and/or to first device substrate 804 (FIG. 8); semiconductor element(s) 1808 can be similar or identical to the semiconductor element(s) described above with respect to method 100 (FIG. 1), to semiconductor element(s) 1108 (FIG. 11), and/or to semiconductor element(s) 1208 (FIG. 12); first bond promoting layer 1803 can be similar or identical to the first bond promoting layer of method 100 (FIG. 1), to first bond promoting layer 703 (FIG. 7), and/or to first bond promoting layer 803 (FIG. 8); and/or carrier substrate 1801 can be similar or identical to the carrier substrate of method 100 (FIG. 1), to first bond promoting layer 701 (FIG. 7), and/or to first bond promoting layer 801 (FIG. 8).

Figure 15:
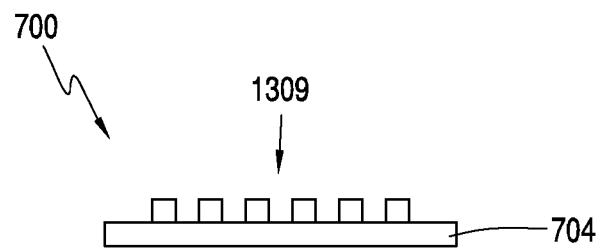
FIG. 15 illustrates a cross-sectional view of the device portion of the first device substrate of the electronic device after de-bonding the device portion from the second bond promoting layer, according to the embodiment of FIG. 7.
Figure 16:
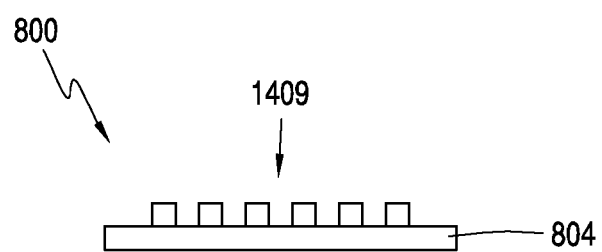
FIG. 16 illustrates a cross-sectional view of the device portion of the first device substrate of the electronic device after de-bonding the device portion from the second bond promoting layer, according to the embodiment of FIG. 8.

Referring again to FIG. 1, method 100 can comprise activity 111 of de-bonding (e.g., mechanically) the device portion of the first device substrate and/or the second device substrate from the first bond promoting layer, the hybrid bond promoting layer, the second bond promoting layer, and/or the carrier substrate, as applicable. FIG. 15 illustrates a cross-sectional view of device portion 1309 of first device substrate 704 of electronic device 700 after de-bonding device portion 1309 from second bond promoting layer 702 (FIG. 7), according to the embodiment of FIG. 7. Meanwhile, FIG. 16 illustrates a cross-sectional view of device portion 1409 of first device substrate 804 of electronic device 800 after de-bonding device portion 1409 from second bond promoting layer 802 (FIG. 8), according to the embodiment of FIG. 8.

Referring back to FIG. 1, in many embodiments, activity 111 can comprise an activity of applying a release force (e.g., a steady release force) to the device portion of the first device substrate and/or the second device substrate in excess of the first device substrate-first bond promoting layer adhesion strength, the first device substrate-hybrid bond promoting layer adhesion strength, the first device substrate-second bond promoting layer adhesion strength, and/or the first device substrate-carrier substrate adhesion strength to de-bond the device portion of the first device substrate and/or the second device substrate from the first bond promoting layer, the hybrid bond promoting layer, the second bond promoting layer, and/or the carrier substrate, as applicable. In many embodiments, the release force can be applied to the device portion by peeling the device portion of the first device substrate and/or the second device substrate (e.g., by hand) from the first bond promoting layer, the hybrid bond promoting layer, the second bond promoting layer, or the carrier substrate, as applicable. In these or other embodiments, the release force can be applied (or augmented) by inserting a blade under the device portion of the first device substrate and/or the second device substrate and pressing on the device portion in a direction away from the first bond promoting layer, the hybrid bond promoting layer, the second bond promoting layer, and/or the carrier substrate, as applicable.

Further, in these or other embodiments, activity 111 can comprise an activity of severing the device portion of the first device substrate and/or the second device substrate from the first bond promoting layer, the hybrid bond promoting layer, the second bond promoting layer, and/or the carrier substrate, as applicable, such as, for example, using any suitable cutting implement (e.g., a blade, a laser, etc.). The activity of severing the device portion of the first device substrate and/or the second device substrate from the first bond promoting layer, the hybrid bond promoting layer, the second bond promoting layer, and/or the carrier substrate, as applicable, can be performed alternatively to or as part of the activity of applying the release force to the device portion of the first device substrate and/or the second device substrate.

In many embodiments, maintaining an angle of less than or equal to approximately 45 degrees between the device portion of the first device substrate and/or the second device substrate and the first bond promoting layer, the hybrid bond promoting layer, the second bond promoting layer, or the carrier substrate, as applicable, when performing activity 111 can mitigate or prevent damage to the semiconductor element(s) at the device portion.

Further, advantageously, in many embodiments, activity 111 can be performed without first lowering the first device substrate-first bond promoting layer adhesion strength, the first device substrate-hybrid bond promoting layer adhesion strength, the first device substrate-second bond promoting layer adhesion strength, and/or the first device substrate-carrier substrate adhesion strength, such as, for example, using chemical or optical de-bonding procedures (e.g., electronics on plastic by laser release (EPLaR™), surface free technology by laser annealing/ablation (SUFTLA™), etc.). That is, the first device substrate-first bond promoting layer adhesion strength, the first device substrate-hybrid bond promoting layer adhesion strength, the first device substrate-second bond promoting layer adhesion strength, and/or the first device substrate-carrier substrate adhesion strength can remain approximately constant, and in many examples, at least remain low enough to permit mechanical de-bonding, directly up until activity 111 is performed. Accordingly, by avoiding using chemical or optical de-bonding procedures (e.g., electronics on plastic by laser release (EPLaR™), surface free technology by laser annealing/ablation (SUFTLA™), etc.), device defects of the semiconductor element(s) and/or decreased electronic device yield that can result from using such chemical or optical de-bonding procedures can be reduced or eliminated. For example, optical de-bonding procedures can damage the semiconductor element(s) through heat distortion and/or formation of particulate debris. Meanwhile, chemical de-bonding procedures can damage the semiconductor element(s) by exposing the semiconductor element(s) to the chemical(s), resulting in degradation of the semiconductor element(s). Moreover, using chemical de-bonding procedures may require subsequent cleaning to remove any residual chemicals from the semiconductor element(s) and/or may not permit the device portion of the first device substrate and/or the second device substrate to be kept approximately flat during de-bonding because physically constraining the device portion while immersing the device portion in chemicals can be challenging.

Further, method 100 can comprise activity 112 of cleaning the carrier substrate, such as, for example, to remove residual parts of the semiconductor element(s), the second device substrate, the first device substrate, the first bond promoting layer, the hybrid bond promoting layer, and/or the second bond promoting layer from the carrier substrate remaining after performing activity 111. In some embodiments, activity 112 can comprise an activity of cleaning the carrier substrate with plasma (e.g., $O_2$ plasma). Accordingly, in many embodiments, method 100 can be repeated one or more times using the same carrier substrate.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that one or more activities of method 100 (FIG. 1) may be comprised of many different activities, procedures, and/or processes and may be performed by many different modules and in many different orders, that any elements of FIGS. 1-18 may be modified, and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method comprising:
providing a carrier substrate;
providing a first bond promoting layer over the carrier substrate, the first bond promoting layer comprising a first bond promoting layer material;
providing a second bond promoting layer over the carrier substrate, the second bond promoting layer comprising a second bond promoting layer material different than the first bond promoting layer material; and
depositing a first device substrate over the carrier substrate, the first bond promoting layer, and the second bond promoting layer;
wherein:
the first device substrate is configured to bond to the carrier substrate with a first device substrate-carrier substrate adhesion strength;
depositing the first device substrate comprises:
bonding the first device substrate to the first bond promoting layer, the first device substrate bonding to the first bond promoting layer with a first device substrate-first bond promoting layer adhesion strength greater than the first device substrate-carrier substrate adhesion strength; and
coupling the first device substrate to the carrier substrate; and
at least one of:
the first device substrate-carrier substrate adhesion strength comprises a first tensile adhesion strength less than approximately 0.0390 MegaPascal, and the first device substrate-first bond promoting layer adhesion strength comprises a second tensile adhesion strength greater than or equal to approximately 0.0390 MegaPascal, or
the first device substrate-carrier substrate adhesion strength comprises a first peel adhesion strength less than approximately 0.0100 kilogram per centimeter, and the first device substrate-first bond promoting layer adhesion strength comprises a second peel adhesion strength greater than or equal to approximately 0.0100 kilogram per centimeter.

2. The method of claim 1 wherein:
depositing the first device substrate further comprises:
bonding the first device substrate to the second bond promoting layer, the first device substrate bonding to the second bond promoting layer with a first device substrate-second bond promoting layer adhesion strength greater than the first device substrate-carrier substrate adhesion strength and less than the first device substrate-first bond promoting layer adhesion strength.

3. The method of claim 2 wherein:
providing the second bond promoting layer over the carrier substrate comprises:
bonding the second bond promoting layer to the carrier substrate with a second bond promoting layer-carrier substrate adhesion strength greater than the first device substrate-second bond promoting layer adhesion strength.

4. The method of claim 1 wherein:
providing the first bond promoting layer over the carrier substrate comprises depositing the first bond promoting layer over the second bond promoting layer.

5. The method of claim 1 wherein:
providing the second bond promoting layer over the carrier substrate comprises depositing the second bond promoting layer over the first bond promoting layer.

6. The method of claim 5 wherein:
depositing the second bond promoting layer over the first bond promoting layer comprises forming a hybrid bond promoting layer over the carrier substrate; and
bonding the first device substrate to the first bond promoting layer comprises bonding the first device substrate to the hybrid bond promoting layer, the first device substrate bonding to the hybrid bond promoting layer with a first device substrate-hybrid bond promoting layer adhesion strength approximately equal to the first device substrate-first bond promoting layer adhesion strength.

7. The method of claim 1 wherein:
the second bond promoting layer material comprises at least one of 3-hexamethyldisilazane or Bis[3-(triethoxysilyl)propyl]amine.

8. The method of claim 1 wherein:
the second bond promoting layer comprises a second bond promoting layer thickness greater than or equal to approximately one monolayer and less than or equal to approximately five monolayers.

9. The method of claim 1 wherein:
the second tensile adhesion strength is less than or equal to approximately 0.785 MegaPascal; and
the second peel adhesion strength is less than or equal to approximately 0.800 kilogram per centimeter.

10. The method of claim 1 wherein:
bonding the first device substrate to the first bond promoting layer and coupling the first device substrate to the carrier substrate occur approximately simultaneously with each other.

11. The method of claim 1 wherein:
the carrier substrate comprises a rigid substrate; or
the first device substrate comprises a flexible substrate.

12. The method of claim 1 wherein:
the carrier substrate comprises a carrier substrate material; one of:
the carrier substrate material comprises a silicon material; or
the carrier substrate material is at least partially coated with the silicon material; and
the first device substrate comprises a device substrate material comprising at least one of polyimide or polyamide.

13. The method of claim 1 wherein:
the first bond promoting layer material comprises at least one of:
(3-Aminopropyl)triethoxysilane,
3-Aminopropyl(diethoxy)methylsilane, or
Bis[3-(triethoxysilyl)propyl]amine.

14. The method of claim 1 wherein:
providing the first bond promoting layer over the carrier substrate comprises providing the first bond promoting layer over only a perimeter portion of a second surface of the carrier substrate.

15. The method of claim 1 wherein at least one of:
the carrier substrate comprises a carrier substrate thickness greater than or equal to approximately 300 micrometers and less than or equal to approximately 2 millimeters;
the first bond promoting layer comprises a first bond promoting layer thickness greater than or equal to approximately one monolayer and less than or equal to approximately 1 micrometer; or the first device substrate comprises a device substrate thickness greater than or equal to approximately 0.5 micrometer and less than or equal to approximately 200 micrometers.

16. The method of claim 1 further comprising:
after depositing the first device substrate over the carrier substrate, providing one or more semiconductor elements over the first device substrate while the first device substrate is coupled to the carrier substrate.

17. The method of claim 16 further comprising:
after providing the one or more semiconductor elements over the first device substrate, mechanically decoupling at least part of the first device substrate from the carrier substrate.

18. A method comprising:
providing a carrier substrate;
providing a first bond promoting layer over the carrier substrate, the first bond promoting layer comprising a first bond promoting layer material;
providing a second bond promoting layer over the carrier substrate, the second bond promoting layer comprising a second bond promoting layer material different than the first bond promoting layer material; and
depositing a first device substrate over the carrier substrate, the first bond promoting layer, and the second bond promoting layer;
wherein:
  the first device substrate is configured to bond to the carrier substrate with a first device substrate-carrier substrate adhesion strength;
  depositing the first device substrate comprises:
    bonding the first device substrate to the first bond promoting layer, the first device substrate bonding to the first bond promoting layer with a first device substrate-first bond promoting layer adhesion strength greater than the first device substrate-carrier substrate adhesion strength; and
    coupling the first device substrate to the carrier substrate;
  at least one of:
    the first device substrate-carrier substrate adhesion strength comprises a first tensile adhesion strength less than approximately 0.0390 MegaPascal, and the first device substrate-first bond promoting layer adhesion strength comprises a second tensile adhesion strength greater than or equal to approximately 0.0390 MegaPascal; or
    the first device substrate-carrier substrate adhesion strength comprises a first peel adhesion strength less than approximately 0.0100 kilogram per centimeter, and the first device substrate-first bond promoting layer adhesion strength comprises a second peel adhesion strength greater than or equal to approximately 0.0100 kilogram per centimeter;
  providing the first bond promoting layer over the carrier substrate comprises providing the first bond promoting layer over a perimeter portion of the carrier substrate;
  the carrier substrate comprises a rigid substrate; and
  the first device substrate comprises a flexible substrate.

19. A system comprising:
a carrier substrate comprising a rigid substrate;
a first bond promoting layer over the carrier substrate, the first bond promoting layer comprising a first bond promoting layer material;
a second bond promoting layer over the carrier substrate, the second bond promoting layer comprising a second bond promoting layer material different than the first bond promoting layer material; and
a first device substrate over the carrier substrate, the first bond promoting layer, and the second bond promoting layer;
wherein:
  the first device substrate is configured to bond to the carrier substrate with a first device substrate-carrier substrate adhesion strength;
  the first device substrate is bonded to the first bond promoting layer with a first device substrate-first bond promoting layer adhesion strength greater than the first device substrate-carrier substrate adhesion strength, and is coupled to the carrier substrate;
  at least one of:
    the first device substrate-carrier substrate adhesion strength comprises a first tensile adhesion strength less than approximately 0.0390 MegaPascal, and the first device substrate-first bond promoting layer adhesion strength comprises a second tensile adhesion strength greater than or equal to approximately 0.0390 MegaPascal; or
    the first device substrate-carrier substrate adhesion strength comprises a first peel adhesion strength less than approximately 0.0100 kilogram per centimeter, and the first device substrate-first bond promoting layer adhesion strength comprises a second peel adhesion strength greater than or equal to approximately 0.0100 kilogram per centimeter;
  the first bond promoting layer is over a perimeter portion of the carrier substrate; and
  the first device substrate comprises a flexible substrate.

20. The system of claim 19 further comprising:
one or more semiconductor elements over the first device substrate.

* * * * *